(12) United States Patent
Sekikawa et al.

(10) Patent No.: US 10,546,802 B2
(45) Date of Patent: Jan. 28, 2020

(54) SEMICONDUCTOR DEVICE INCLUDING A SUBSTRATE CONTACT PLUG AND MANUFACTURING METHOD THEREOF

(71) Applicant: Renesas Electronics Corporation, Koutou-ku, Tokyo (JP)

(72) Inventors: Hiroaki Sekikawa, Tokyo (JP); Shigeo Tokumitsu, Ibaraki (JP); Asuka Komuro, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/908,597

(22) Filed: Feb. 28, 2018

(65) Prior Publication Data

US 2018/0261530 A1    Sep. 13, 2018

(30) Foreign Application Priority Data

Mar. 9, 2017    (JP) .................................. 2017-044587

(51) Int. Cl.
*H01L 23/48*    (2006.01)
*H01L 29/06*    (2006.01)
(Continued)

(52) U.S. Cl.
CPC ...... *H01L 23/481* (2013.01); *H01L 21/76224* (2013.01); *H01L 21/76877* (2013.01);
(Continued)

(58) Field of Classification Search
CPC . H01L 27/0922; H01L 23/528; H01L 21/743; H01L 29/1087; H01L 21/823878; H01L 23/481; H01L 23/5226; H01L 21/76224; H01L 29/0653; H01L 21/76877; H01L 21/764; H01L 21/823481; H01L 27/0617; H01L 21/823892; H01L 21/823814; H01L 29/66659; H01L 29/7835; H01L 29/408; H01L 29/7809; H01L 29/7813; H01L 21/8238; H01L 29/66681; H01L 27/092; H01L 29/7816; H01L 29/063; H01L 29/407; H01L 29/66734; H01L 21/823456; H01L 29/1095; H01L 29/7802–7815; H01L 29/66712–66734; H01L 21/8228
See application file for complete search history.

(56) References Cited

U.S. PATENT DOCUMENTS

2011/0062547 A1    3/2011 Onishi et al.
2011/0175205 A1    7/2011 Morii et al.
(Continued)

FOREIGN PATENT DOCUMENTS

JP    H08-037289 A    2/1996
JP    2011-066067 A    3/2011
(Continued)

*Primary Examiner* — Nelson Garces
(74) *Attorney, Agent, or Firm* — Shapiro, Gabor and Rosenberger, PLLC

(57) ABSTRACT

A substrate contact plug which is connected to a wiring and a semiconductor substrate and does not form a circuit is formed in a seal ring region in a peripheral portion of a semiconductor chip region. The substrate contact plug is buried in a trench which is deeper than an element isolation trench.

12 Claims, 28 Drawing Sheets

(51) Int. Cl.
*H01L 21/768* (2006.01)
*H01L 21/762* (2006.01)
*H01L 23/522* (2006.01)
*H01L 27/092* (2006.01)

(52) U.S. Cl.
CPC ...... *H01L 23/5226* (2013.01); *H01L 27/0922* (2013.01); *H01L 29/0653* (2013.01)

(56) References Cited

U.S. PATENT DOCUMENTS

| | | | |
|---|---|---|---|
| 2013/0134549 A1 | 5/2013 | Onishi et al. | |
| 2015/0041960 A1* | 2/2015 | Morii | H01L 29/7833 257/621 |
| 2017/0162572 A1 | 6/2017 | Morii et al. | |
| 2018/0082997 A1* | 3/2018 | Li | H01L 27/0617 |

FOREIGN PATENT DOCUMENTS

| | | |
|---|---|---|
| JP | 2011-151121 A | 8/2011 |
| JP | 2015-037099 A | 2/2015 |

\* cited by examiner

FIG. 20

SEMICONDUCTOR DEVICE INCLUDING A SUBSTRATE CONTACT PLUG AND MANUFACTURING METHOD THEREOF

CROSS-REFERENCE TO RELATED APPLICATION

The present application claims priority from Japanese Patent Application No. 2017-044587 filed on Mar. 9, 2017, the content of which is hereby incorporated by reference into this application.

TECHNICAL FIELD OF THE INVENTION

The present invention relates to a semiconductor device and a manufacturing method thereof, and particularly to a technique which is effectively applied to a semiconductor device including a substrate contact plug.

BACKGROUND OF THE INVENTION

There is a semiconductor device in which an element isolation structure in which an insulating film is formed in a high aspect ratio trench whose aspect ratio corresponding to a ratio of a depth of the trench to a width of the trench is higher than 1 (deep trench isolation (DTI) structure) is provided in a main surface of a semiconductor substrate. In addition, there is known a substrate contact plug which is formed in the deep trench like this formed in the main surface of the semiconductor substrate and is connected to the semiconductor substrate at the bottom surface of the trench.

Further, a seal ring made of a metal member formed in an outer periphery of a semiconductor chip is known as a structure to prevent moisture from entering a circuit region of the semiconductor chip due to a dicing process performed to obtain a plurality of semiconductor chips by cutting a semiconductor wafer, and to prevent metallic contamination of the circuit region due to the dicing process.

Patent Document 1 (Japanese Patent Application Laid-Open Publication No. 2011-66067) and Patent Document 2 (Japanese Patent Application Laid-Open Publication No. 2011-151121) disclose an element isolation using a deep trench.

Patent Document 3 (Japanese Patent Application Laid-Open Publication No. 2015-37099) discloses a structure in which a plug is formed in a deep trench and the plug is connected to a semiconductor substrate.

Patent Document 4 (Japanese Patent Application Laid-Open Publication No. H8-37289) discloses a structure of a seal ring.

SUMMARY OF THE INVENTION

In order to form a substrate contact plug in a trench deeper than other element isolation trenches in a circuit region, it is conceivable to form the trench, which reaches a deep position of the semiconductor substrate from an upper surface of an interlayer insulating film on the semiconductor substrate, by dry etching. In this case, since an insulating altered layer is formed at the bottom of the trench, a connection failure occurs between the substrate contact plug and the semiconductor substrate, which causes a problem that the semiconductor device does not operate normally.

Other objects and novel features of the present invention will be apparent from the description of the present specification and the accompanying drawings.

The following is a brief description of an outline of the typical embodiment disclosed in the present application.

In a semiconductor device according to an embodiment, a substrate contact plug which is connected to a wiring and a semiconductor substrate and does not form a circuit is formed in a seal ring region.

According to an embodiment disclosed in the present application, it is possible to improve reliability of a semiconductor device. In particular, it is possible to prevent occurrence of a connection failure of a substrate contact plug in a circuit region.

BRIEF DESCRIPTIONS OF THE DRAWINGS

FIG. 20 is a cross-sectional view for describing a semiconductor device according to a second modification of the second embodiment of the present invention;

DESCRIPTIONS OF THE PREFERRED EMBODIMENTS

Figure 1:
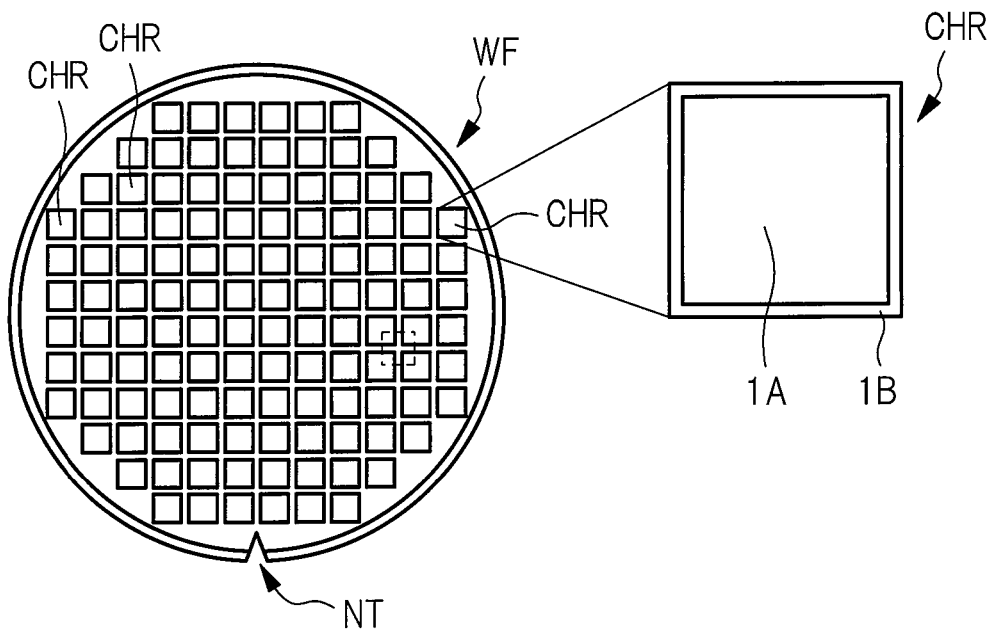
FIG. 1 is a plan view for describing a semiconductor device according to a first embodiment of the present invention.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference characters throughout the drawings for describing the embodiments, and the repetitive description thereof will be omitted. In addition, the description of the same or similar portions is not repeated in principle unless particularly required in the following embodiments.

A semiconductor device of the present application mainly relates to a structure of a seal ring region of a semiconductor chip. In the following descriptions, the embodiments are sometimes described based on the drawings showing a structure of a semiconductor wafer before being diced into individual pieces as in FIGS. 1, 2, and 4. However, the semiconductor device of the embodiments includes the semiconductor chip (see FIG. 3) after the dicing process as well as the semiconductor wafer.

First Embodiment

<Structure of Semiconductor Device>

Figure 2:
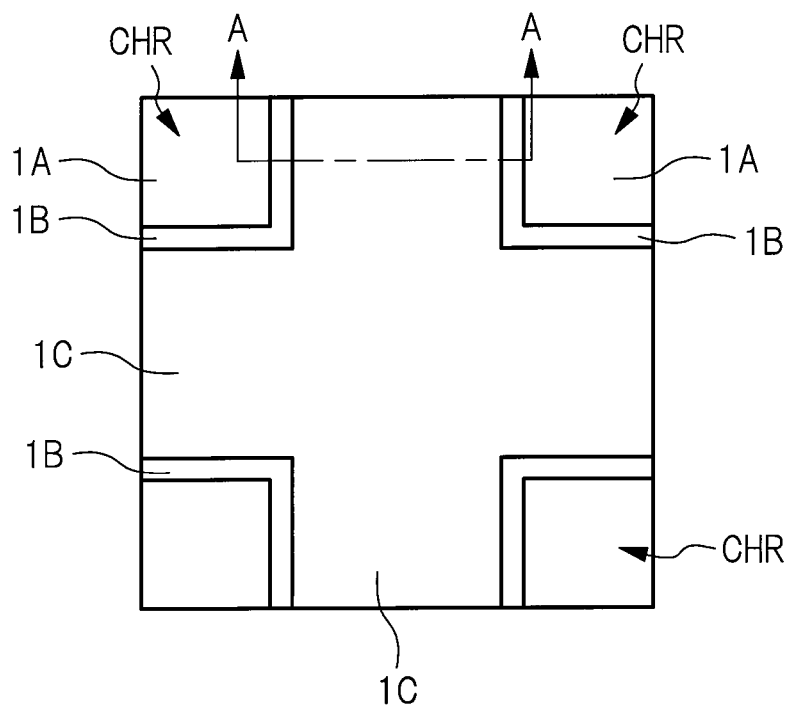
FIG. 2 is a plan view for describing the semiconductor device according to the first embodiment of the present invention.
Figure 3:
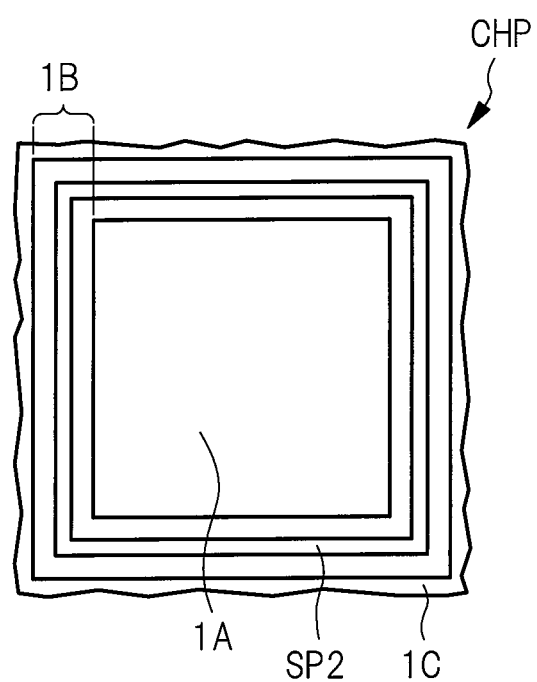
FIG. 3 is a plan view for describing the semiconductor device according to the first embodiment of the present invention.
Figure 4:
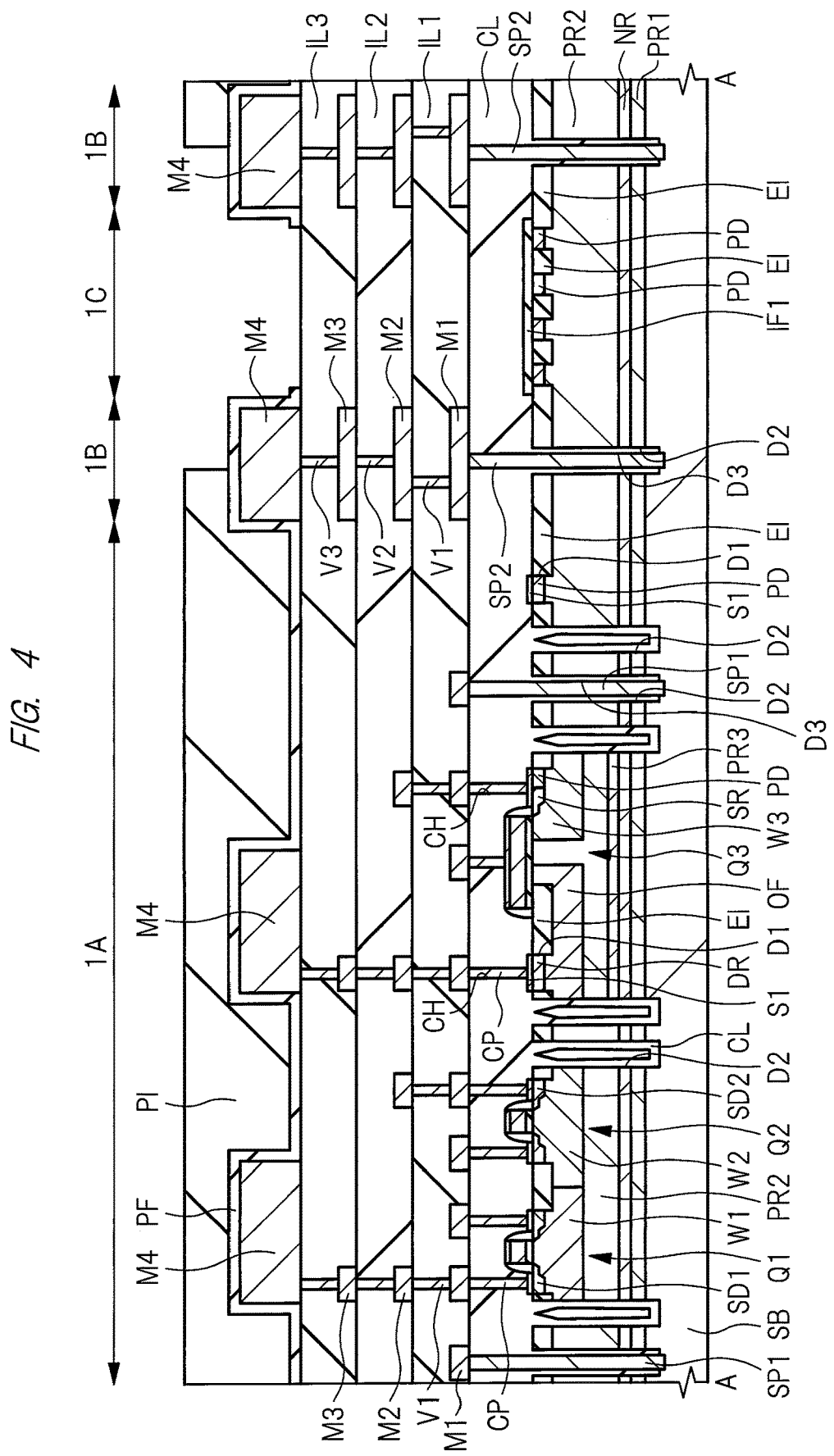
FIG. 4 is a cross-sectional view taken along line A-A of FIG. 2.

Hereinafter, a structure of the semiconductor device of the present embodiment will be described with reference to FIGS. 1 to 4. FIGS. 1 to 3 are plan views for describing the semiconductor device according to the first embodiment of the present invention. FIG. 4 is a cross-sectional view for describing the semiconductor device of the present embodiment. FIG. 4 is a cross-sectional view taken along line A-A of FIG. 2. In FIG. 4, a circuit region 1A, a seal ring region 1B, a scribe region (scribe line) 1C, and a seal ring region 1B are shown from the left side.

FIG. 1 shows a plan view of a semiconductor wafer WF including the semiconductor device of the present embodiment and an enlarged plan view of one chip region CHR extracted from a plurality of chip regions CHR which are disposed in an array on a main surface of the semiconductor wafer WF. In plan view, the chip region CHR has a rectangular shape, and includes the circuit region 1A and the seal ring region 1B. A semiconductor substrate SB is a p-type substrate made of single crystal silicon (Si), and includes a main surface which is a first surface where a semiconductor element such as a transistor is formed and a rear surface (back surface) which is a second surface on the opposite side.

Note that the semiconductor wafer WF mentioned in the present application indicates a circular substrate before being cut into individual pieces or a stacked structure including a circular substrate before being cut into individual pieces and a semiconductor element and a wiring layer formed on the substrate depending on cases. Meanwhile, the semiconductor substrate SB (see FIG. 4) mentioned in the present application indicates a substrate constituting the semiconductor wafer WF or a substrate constituting the semiconductor chip in a form of an individual piece depending on cases; however, in any case, the semiconductor substrate SB does not include the semiconductor element and the wiring layer on the substrate (for example, silicon substrate).

As shown in FIG. 1, the semiconductor wafer WF (semiconductor substrate SB) having a circular shape in plan view includes a notch NT at a part of an edge portion in plan view. In addition, the plurality of chip regions CHR which are arranged in a matrix are present on the main surface of the semiconductor wafer WF. In plan view, each of the chip regions CHR has a rectangular shape, and includes the circuit region 1A and the seal ring region 1B. The circuit region 1A is a region where desired analog and digital circuits are formed, and is more specifically a region where a semiconductor element, a wiring, a contact plug (conductive connection portion), a substrate contact plug (substrate connection portion), and a via (conductive connection portion) constituting the circuit are formed. In plan view, the circuit region 1A of each chip region CHR is positioned inside the annular seal ring region 1B.

The seal ring region 1B is a region where a metal wiring and a substrate contact plug are disposed so as to prevent cracks from being formed inside the seal ring region 1B, moisture from entering the circuit region 1A, and metallic contamination of the circuit region 1A when the semiconductor wafer WF is cut out by a dicing blade. Therefore, the seal ring region 1B is formed in an annular shape at the end of the chip region CHR to protect the circuit region 1A at the center of the chip region CHR. A width in the transverse direction of the seal ring region 1B extending in one direction is, for example, about 6 µm.

The plurality of chip regions CHR are arranged in a first direction and a second direction along the upper surface of the semiconductor wafer WF. The first direction and the second direction are orthogonal to each other. The plurality of chip regions CHR arranged on the upper surface of the semiconductor wafer WF are separated from each other. A region between the adjacent chip regions CHR is the scribe region 1C. In other words, the scribe region 1C is positioned on the opposite side to the circuit region 1A with the seal ring region 1B as a boundary interposed therebetween. Namely, each chip region CHR is surrounded by the scribe region 1C.

In addition, the scribe region 1C extends in the first direction or the second direction. The scribe region 1C is a region, a part of which is cut out along the extending direction of the scribe region 1C. Namely, the scribe region 1C is a region, a part of which is removed so as to separate the chip regions CHR. The chip region CHR being cut in a form of individual piece becomes a semiconductor chip CHP (see FIG. 3).

FIG. 2 shows a place where the scribe region 1C extending in the first direction and the scribe region 1C extending in the second direction intersect in an enlarged manner. FIG. 2 is a plan view showing a region surrounded by a broken line of FIG. 1 in an enlarged manner. As shown in FIG. 2, the scribe region 1C extends in the first direction or the second direction, and the scribe region 1C extending in the first direction and the scribe region 1C extending in the second direction are orthogonal to each other. A width in the transverse direction of the scribe region 1C extending in one direction is, for example, about 100 µm.

FIG. 3 shows one of the semiconductor chips CHP which are a plurality of semiconductor chips obtained in the form of individual pieces through the dicing process of the semiconductor wafer WF (see FIG. 1). In the dicing process, the semiconductor wafer is separated into the individual semiconductor chips by cutting out along the scribe region (scribe line) 1C of the semiconductor wafer by the dicing blade. As shown in FIG. 3, the semiconductor chip CHP mainly includes the chip region CHR (see FIG. 1), and includes a part of the scribe region 1C at the end.

A width of the dicing blade used in the dicing process is smaller than the width in the transverse direction of the scribe region 1C. Therefore, a part of the scribe region 1C is left at the end of the semiconductor chip CHP even after being cut by the dicing process. This is because there is a variation in cutting range and it is necessary to prevent the seal ring region 1B from being cut out due to the variation.

The seal ring region 1B is a region provided for the protection of the circuit region 1A at the center of the semiconductor chip CHP, and is thus formed in an annular shape so as to surround the periphery of the circuit region 1A in plan view. In other words, the seal ring region 1B is formed in a rectangular shape along four sides corresponding to the outer periphery of the semiconductor chip CHP which has a rectangular shape in plan view. Namely, the seal ring region 1B is formed in a frame shape in plan view, and the wiring and the via formed in the seal ring region 1B described below with reference to FIG. 4 are also formed in an annular shape along the extending direction of the seal ring region 1B. Herein, as shown in FIG. 3, a substrate contact plug SP2 formed in the seal ring region 1B also has an annular rectangular shape in plan view. Namely, the substrate contact plug SP2 has four extending portions, and these extending portions are linked at right angles in the vicinity of the corners of the semiconductor chip CHP so as to continuously surround the circuit region 1A.

FIG. 4 is a cross-sectional view of the semiconductor device of the present embodiment, and the case in which the scribe region 1C is not cut out is shown. FIG. 4 is a cross-sectional view taken along the transverse direction of the seal ring region 1B and the scribe region 1C. The seal ring region 1B is disposed between the scribe region 1C and the circuit region 1A.

As shown in FIG. 4, the semiconductor device of the present embodiment includes a stacked substrate which is made up of the semiconductor substrate SB and an epitaxial layer (semiconductor layer) formed on the semiconductor substrate SB by the epitaxial growth method. In the following, the substrate including the semiconductor substrate SB and the epitaxial layer on the semiconductor substrate SB is referred to as a stacked substrate. Note that, since the semiconductor substrate SB and the epitaxial layer are made of semiconductor, the stacked substrate may be referred to as a semiconductor substrate. The epitaxial layer includes a p-type semiconductor region PR1, an n-type buried region NR, and a p-type semiconductor region PR2 which are sequentially formed on the semiconductor substrate SB.

A p-type low breakdown voltage transistor Q1, an n-type low breakdown voltage transistor Q2, and an n-type high breakdown voltage transistor Q3 are formed above the p-type semiconductor region PR2 of the circuit region 1A. Each of the p-type low breakdown voltage transistor Q1, the n-type low breakdown voltage transistor Q2, and the n-type high breakdown voltage transistor Q3 is a MOSFET (Metal Oxide Semiconductor Field Effect Transistor) having an upper surface of the p-type semiconductor region PR2, that is, an upper surface of the stacked substrate as a channel region. Each of the p-type low breakdown voltage transistor Q1 and the n-type low breakdown voltage transistor Q2 is a MOS field effect transistor driven by a voltage lower than that of the n-type high breakdown voltage transistor Q3. The n-type high breakdown voltage transistor Q3 is a MOS field effect transistor having a breakdown voltage of, for example, 45 V. In FIG. 4, the p-type low breakdown voltage transistor Q1, the n-type low breakdown voltage transistor Q2, and the n-type high breakdown voltage transistor Q3 are shown in order from the left side.

The p-type low breakdown voltage transistor Q1, the n-type low breakdown voltage transistor Q2, and the n-type high breakdown voltage transistor Q3 are isolated from each other by an element isolation region EI which is made of an insulating film buried in a trench (isolation trench) D1 formed in the upper surface of the stacked substrate. The element isolation region EI is mainly made of, for example, silicon oxide. The element isolation region EI is formed in any of the circuit region 1A, the seal ring region 1B, and the scribe region 1C. In the scribe region 1C, a plurality of pseudo element isolation regions EI which are not used for element isolation are formed.

An n-type well W1 and a p-type well W2 deeper than the trench D1 are formed adjacent to each other in the upper surface of the p-type semiconductor region PR2, and the p-type low breakdown voltage transistor Q1 is formed on the n-type well W1 and the n-type low breakdown voltage transistor Q2 is formed on the p-type well W2. The element isolation region EI is a relatively shallow element isolation portion, and has, for example, a STI (Shallow Trench Isolation) structure.

The p-type low breakdown voltage transistor Q1 has a gate electrode formed on the stacked substrate via a gate insulating film, and side surfaces on both sides of the gate electrode in a gate length direction are covered with sidewalls made of an insulating film. In addition, the p-type low breakdown voltage transistor Q1 has a pair of source-drain regions SD1 which are formed to sandwich the upper surface of the n-type well W1 immediately below the gate electrode. The source-drain regions SD1 are p-type semiconductor regions, and are formed shallower than the element isolation region EI. Each of the pair of source-drain regions SD1 is made up of an extension region and a diffusion region which are adjacent to each other. The gate insulating film is made of, for example, a silicon oxide film, a silicon nitride film, or a stacked structure thereof, and the gate electrode is made of a polysilicon film.

The n-type low breakdown voltage transistor Q2 has a gate electrode formed on the stacked substrate via a gate insulating film, and side surfaces on both sides of the gate electrode in a gate length direction are covered with sidewalls made of an insulating film. In addition, the n-type low breakdown voltage transistor Q2 has a pair of source-drain regions SD2 which are formed to sandwich the upper surface of the p-type well W2 immediately below the gate electrode. The source-drain regions SD2 are n-type semiconductor regions, and are formed shallower than the element isolation region EI. Each of the pair of source-drain regions SD2 is made up of an extension region and a diffusion region which are adjacent to each other. The gate insulating film is made of, for example, a silicon oxide film, a silicon nitride film, or a stacked structure thereof, and the gate electrode is made of a polysilicon film.

The n-type high breakdown voltage transistor Q3 has a gate electrode formed on the stacked substrate via the element isolation region EI and a gate insulating film, and side surfaces on both sides of the gate electrode in a gate length direction are covered with sidewalls made of an insulating film. A length in the gate length direction of the gate electrode of the n-type high breakdown voltage transistor Q3 is larger than that in the gate length direction of each of the p-type low breakdown voltage transistor Q1 and the n-type low breakdown voltage transistor Q2. In addition, a thickness of the gate insulating film of the n-type high breakdown voltage transistor Q3 is equal to or larger than that of the gate insulating film of each of the p-type low breakdown voltage transistor Q1 and then-type low breakdown voltage transistor Q2. The gate insulating film is made of, for example, a silicon oxide film, a silicon nitride film, or a stacked structure thereof, and the gate electrode is made of a polysilicon film.

The n-type high breakdown voltage transistor Q3 has a source region SR and a drain region DR which are formed to sandwich the upper surface of the p-type semiconductor region PR2 immediately below the gate electrode. The source region SR and the drain region DR are n-type semiconductor regions, and are formed shallower than the element isolation region EI. The element isolation region EI buried in the trench D1 is provided between the drain region DR and the upper surface of the p-type semiconductor region PR2 immediately below the gate electrode, and an n-type offset region OF is formed in the surface of the p-type semiconductor region PR2 which is adjacent to the side surface and the bottom surface of the trench D1.

In addition, the source region SR is formed in the upper surface of a p-type well W3 which is formed in the upper surface of the p-type semiconductor region PR2, and a p-type diffusion region PD adjacent to the source region SR is formed in the upper surface of the p-type well W3. The n-type offset region OF and the p-type well W3 are separated from each other immediately below the gate electrode. In addition, a p-type buried region PR3 is formed between the n-type buried region NR and the p-type semiconductor region PR2 immediately below the n-type high breakdown voltage transistor Q3. The source region SR is made up of the extension region and the diffusion region which are adjacent to each other.

The diffusion region constituting each of the source-drain regions SD1 and SD2 and the source region SR has an impurity concentration higher than that of the extension region which is adjacent to the diffusion region. As described above, the source-drain regions SD1 and SD2 and the source region SR each have an LDD (Lightly Doped Drain) structure which includes a diffusion region with a high impurity concentration and an extension region with a low impurity concentration.

The upper surfaces of the source-drain regions of each of the p-type low breakdown voltage transistor Q1, the n-type low breakdown voltage transistor Q2, and the n-type high breakdown voltage transistor Q3, which are exposed from the gate electrodes and the sidewalls, are covered with a silicide layer S1. In addition, the upper surface of each of the gate electrodes is covered with the silicide layer S1. The silicide layer S1 is a conductor layer which is formed by, for example, reacting metal such as Co (cobalt) or Ni (nickel) with Si (silicon). In the scribe region 1C, the p-type diffusion region PD is formed in the upper surface of the p-type semiconductor region PR2 which is exposed from the element isolation region EI, and the upper surfaces of the element isolation region EI and the p-type diffusion region PD of the scribe region 1C are covered with an insulating film IF1. The insulating film IF1 is made of, for example, a silicon oxide film or a silicon nitride film, and is provided to prevent the silicide layer from being formed on the upper surface of the p-type diffusion region PD.

On the stacked substrate, an interlayer insulating film (contact interlayer film) CL mainly made of, for example, a silicon oxide film is formed so as to cover the p-type low breakdown voltage transistor Q1, the n-type low breakdown voltage transistor Q2, the n-type high breakdown voltage transistor Q3, and the insulating film IF1. An upper surface of the interlayer insulating film CL is planarized. In the circuit region 1A, a plurality of contact holes (connection holes) CH penetrating the interlayer insulating film CL from the upper surface to the lower surface of the interlayer insulating film CL are formed, and a plurality of contact plugs (conductive connection portions) CP which are made of a conductor film buried in the respective contact holes CH are formed on the stacked substrate. The contact plug CP is configured of a metal film (conductor film) mainly made of a W (tungsten) film.

The plurality of contact plugs CP are respectively connected to, for example, the p-type low breakdown voltage transistor Q1, the n-type low breakdown voltage transistor Q2, and the n-type high breakdown voltage transistor Q3. Namely, the plurality of contact plugs CP are respectively connected via the silicide layers S1 to the upper surfaces of the gate electrode of the p-type low breakdown voltage transistor Q1, the gate electrode of the n-type low breakdown voltage transistor Q2, the gate electrode of the n-type high breakdown voltage transistor Q3, the source-drain regions SD1 and SD2, the source region SR, and the drain region DR. The silicide layer S1 has a function to reduce connection resistance between the contact plug CP and each of the gate electrodes, the source-drain regions SD1 and SD2, the source region SR, and the drain region DR.

The contact plug CP has, for example, a cylindrical shape, and an average value of a diameter of one contact plug CP, that is, a width in a direction along the main surface of the semiconductor substrate SB (lateral direction, horizontal direction) is, for example, about 0.1 μm. Further, in FIG. 4, the contact plugs CP connected to the gate electrodes of the p-type low breakdown voltage transistor Q1 and the n-type low breakdown voltage transistor Q2 are not illustrated. In addition, the contact plug CP is not formed in the scribe region 1C, and the contact plug CP is not formed also in the seal ring region 1B in the present embodiment. The upper surface of each contact plug CP and the upper surface of the interlayer insulating film CL are planarized to be substantially flush with each other.

On the interlayer insulating film CL, a first wiring layer which includes a plurality of wirings M1 and an interlayer insulating film IL1 that covers the side surfaces and the upper surfaces of the wirings M1 is formed. In addition, the first wiring layer includes vias V1 which penetrate the interlayer insulating film IL1 to be connected to the upper surfaces of the wirings M1. The interlayer insulating film IL1 is made of, for example, a silicon oxide film, the wiring M1 is mainly made of, for example, Al (aluminum), and the via V1 is mainly made of, for example, W (tungsten). A part of the lower surface of the wiring M1 is connected to the upper surface of the contact plug CP. A width in the lateral direction of the wiring M1 is larger than that in the lateral direction of each of the contact plug CP and the via V1. The upper surface of each via V1 and the upper surface of the interlayer insulating film IL1 are planarized to be substantially flush with each other.

On the first wiring layer, a second wiring layer and a third wiring layer having the same configuration as the first wiring layer are sequentially stacked. Namely, the second wiring layer includes wirings M2 which are connected to the upper surfaces of the vias V1, an interlayer insulating film IL2 which covers the wirings M2, and vias V2 which penetrate the interlayer insulating film IL2 to be connected to the upper surfaces of the wirings M2. In addition, the third wiring layer includes wirings M3 which are connected to the upper surfaces of the vias V2, an interlayer insulating film IL3 which covers the wirings M3, and vias V3 which penetrate the interlayer insulating film IL3 to be connected to the upper surfaces of the wirings M3. On the third wiring layer, a plurality of wirings M4 connected to the upper surfaces of the vias V3 are formed. The wiring M4 is a wiring pattern mainly made of Al (aluminum).

The upper surfaces and the side surfaces of the wirings M4 and the upper surface of the interlayer insulating film IL3 are covered with a passivation film PF and a polyimide film PI sequentially formed over the interlayer insulating film IL3. However, the upper surface of the interlayer insulating film IL3 of the scribe region 1C is exposed from the passivation film PF except the end of the scribe region 1C. In addition, the polyimide film PI is not formed in the scribe region 1C. Further, in a bonding pad portion (not shown), the passivation film PF and the polyimide film PI are removed, so that a bonding wire or the like can be connected to the upper surface of the wiring M4.

The wirings M1 to M4, the vias V1 to V3, and the contact plugs CP of the circuit region 1A are electrically connected to each other. Namely, the wiring M4 is electrically connected to the semiconductor element through the via V3, the wiring M3, the via V2, the wiring M2, the via V1, the wiring M1, the contact plug CP, and the silicide layer S1, thereby forming a circuit.

Herein, in the upper surface of apart of the element isolation region EI, a plurality of trenches D2 which reach an intermediate depth of the semiconductor substrate SB from the upper surface of the element isolation region EI are formed. Namely, the trench D2 penetrates the element isolation region EI, the p-type semiconductor region PR2, the n-type buried region NR, and the p-type semiconductor region PR1. In other words, the trench D2 is formed in the upper surface of the stacked substrate. A depth from the uppermost surface of the stacked substrate to the bottom surface of the trench D2 is larger than the depth from the uppermost surface of the stacked substrate to the bottom surface of the trench D1. Namely, the depth of the trench D2 is larger than that of the trench D1. A part of the interlayer insulating film CL is buried in a part of each of the trenches D2. Note that, in the scribe region 1C, the trench D1 is formed, but the trench D2 is not formed.

A void (hollow part) surrounded by the interlayer insulating film CL is formed in each of the trenches D2 used as the element isolation portion among the plurality of trenches D2. Namely, the bottom surface and the side surfaces of the trench D2 are covered with the interlayer insulating film CL. In the following, the trench D2 used as the element isolation portion is sometimes referred to as a DTI (Deep Trench Isolation) structure. The DTI structure is formed to electrically isolate a CMOS (Complementary Metal Oxide Semiconductor) made up of the p-type low breakdown voltage transistor Q1 and the n-type low breakdown voltage transistor Q2 from the n-type high breakdown voltage transistor Q3, for example. In addition, for example, the DTI structure is formed to prevent the semiconductor element and a substrate contact plug SP1 described below from being electrically connected in the lateral direction. Since the DTI structure has a structure including the void, the DTI structure has a higher insulating property compared to a structure in which the trench D2 is completely buried with the interlayer insulating film CL.

In addition, the substrate contact plug (substrate connection portion) SP1 or SP2 is buried in some of the trenches D2 among the plurality of trenches D2. Namely, a part of the interlayer insulating film CL is buried in some of the trenches D2, a trench D3 which is a contact hole (substrate contact trench, connection hole) reaching the bottom surface of the trench D2 from the upper surface of the interlayer insulating film CL through the inside of the trench D2 is formed in the trenches D2, and the substrate contact plug SP1 or SP2 which is made of a conductor film connected to the upper surface of the semiconductor substrate SB is buried in the trench D3. In other words, the trench (substrate contact trench, contact hole, connection hole) D3 is formed within a range overlapping with the trench D2 in plan view so as to be separated from the side surface of the trench D2. A part of the interlayer insulating film CL is formed between the side surface of the trench D3 and the side surface of the trench D2. Each of the substrate contact plugs SP1 and SP2 is configured of a metal film (conductor film) mainly made of a W (tungsten) film.

A part of the trench D3 is configured of the void in the trench D2. The substrate contact plugs SP1 and SP2 are formed from the upper surface of the interlayer insulating film CL to the bottom surface of each trench D2, and are formed by filling the voids in the trenches D2 with a conductor film. The substrate contact plugs SP1 and SP2 are electrically connected to the semiconductor substrate SB at the bottom surfaces of the trenches D2. The trench D3 is formed from the upper side above the trench D2 to the intermediate depth of the semiconductor substrate SB which is at a position deeper than the bottom surface of the trench D2. Namely, the depth from the uppermost surface of the stacked substrate to the bottom surface of the trench D3 is larger than the depth from the uppermost surface of the stacked substrate to the bottom surface of the trench D2. In other words, the depth of the trench D3 is larger than that of the trench D2.

In the circuit region 1A, the plurality of substrate contact plugs SP1 are provided as a conductive connection portion for applying a predetermined voltage to the semiconductor substrate SB. The upper surface of the substrate contact plug SP1 is connected to the lower surface of the wiring M1. Namely, the substrate contact plug SP1 is electrically connected to the semiconductor substrate SB and the wiring M1, thereby forming a circuit.

In addition, as one of main features of the present embodiment, the substrate contact plug SP2 is formed in the seal ring region 1B. The substrate contact plug SP2 is not electrically connected to semiconductor elements such as the p-type low breakdown voltage transistor Q1, the n-type low breakdown voltage transistor Q2, and the n-type high breakdown voltage transistor Q3 of the circuit region 1A and the wirings M1 to M4 of the circuit region 1A.

In addition, the wirings M1 to M4 and the vias V1 to V3 are formed in the seal ring region 1B, and these conductor films are electrically connected to the substrate contact plug SP2 connected to the lower surface of the wiring M1. However, the wirings M1 to M4 and the vias V1 to V3 of the seal ring region 1B are not electrically connected to semiconductor elements such as the p-type low breakdown voltage transistor Q1, the n-type low breakdown voltage transistor Q2, and the n-type high breakdown voltage transistor Q3 of the circuit region 1A and the wirings M1 to M4 of the circuit region 1A. Namely, the substrate contact plug SP2, the wirings M1 to M4, and the vias V1 to V3 of the seal ring region 1B do not form a circuit, and the substrate contact plug SP2 may be referred to as a pseudo substrate connection portion (dummy substrate contact plug) having an electrical conductivity.

The substrate contact plug SP1 is not formed in the seal ring region 1B and the scribe region 1C, and the substrate contact plug SP2 is not formed in the circuit region 1A and the scribe region 1C. The trenches D2 of the circuit region 1A and the seal ring region 1B penetrate the interlayer insulating film CL and the element isolation region EI, and reach an intermediate depth of the semiconductor substrate SB. Namely, the trenches D2 and D3 are formed at positions overlapping with the trenches D1 in plan view.

The trenches D2 and D3 and the substrate contact plug SP2 of the seal ring region 1B extend along a planar layout of the seal ring region 1B shown in FIG. 3, and have a continuous pattern formed in an annular shape in plan view. Namely, the trenches D2 and D3 and the substrate contact plug SP2 extend in a direction perpendicular to the page of FIG. 4. Similarly, the substrate contact plug SP2, the wirings M1 to M4, and the vias V1 to V3 of the seal ring region 1B extend along a planar layout of the seal ring region 1B shown in FIG. 3, and have a continuous pattern formed in an annular shape in plan view. A width in the transverse direction of the trench D2 is, for example, 0.8 μm, and widths in the transverse direction of the trench D3 and the substrate contact plug SP2 are, for example, 0.5 μm. Namely, the widths in the transverse direction of the trench D3 and the substrate contact plug SP2 are larger than the diameter of the contact plug CP.

It is conceivable that the substrate contact plug SP1 has a layout extending in a predetermined direction in plan view, but may have a cylindrical structure that does not extend in plan view. In a case where the substrate contact plug SP1 has a pattern extending in a direction along the main surface of the semiconductor substrate SB, for example, a width in the transverse direction of the substrate contact plug SP1 is equal to a width in the transverse direction of the substrate contact plug SP2. In addition, in a case where the substrate contact plug SP1 has a cylindrical structure, for example, an average value of the diameter of the substrate contact plug SP1 is equal to the width in the transverse direction of the substrate contact plug SP2.

In the semiconductor device of the present embodiment, the p-type low breakdown voltage transistor Q1, the n-type low breakdown voltage transistor Q2, the n-type high breakdown voltage transistor Q3, and a passive element (not shown) of the circuit region 1A are electrically connected to each other by the contact plugs CP, the wirings M1 to M4, and the vias V1 to V3, thereby forming a desired analog/digital circuit in the circuit region 1A.

Note that W (tungsten) is exemplified as a material of the substrate contact plugs SP1 and SP2 here, but Cu (copper) or polysilicon may be used as a material which is buried in the trenches D3 to form the substrate contact plugs SP1 and SP2. In addition, since there is a possibility that a stepped portion is generated on the upper surface of the wiring M1 immediately above the substrate contact plug SP2, the via V1 of the seal ring region 1B is preferably disposed while avoiding the position immediately above the substrate contact plug SP2.

In the structure described in the present embodiment, the silicide layer S1 is not formed in the scribe region 1C, and a metal film such as the wiring is also not formed therein. However, a dummy pattern formed of the gate electrode or the metal wiring, an alignment mark used to fabricate the semiconductor device, or a mark used in various property evaluations may be formed in the scribe region 1C as long as a dicing performance is not adversely affected.

<Manufacturing Method of Semiconductor Device>

Hereinafter, a manufacturing method of the semiconductor device of the present embodiment will be described with reference to FIGS. 1, 3, and 5 to 12. FIGS. 5 to 12 are cross-sectional views showing the manufacturing process of the semiconductor device according to the present embodiment. In FIGS. 5 to 12, the circuit region 1A, the seal ring region 1B, the scribe region (scribe line) 1C, and the seal ring region 1B are shown in order from the left side. The scribe region 1C is a region to be cut when the semiconductor wafer is divided into individual pieces in the manufacturing process of the semiconductor device, the seal ring region 1B is a region positioned in the peripheral portion of the semiconductor chip region corresponding to the region to be the semiconductor chip obtained in the dicing process, and the circuit region 1A is a region where an element and a wiring constituting a circuit are formed.

Figure 5:
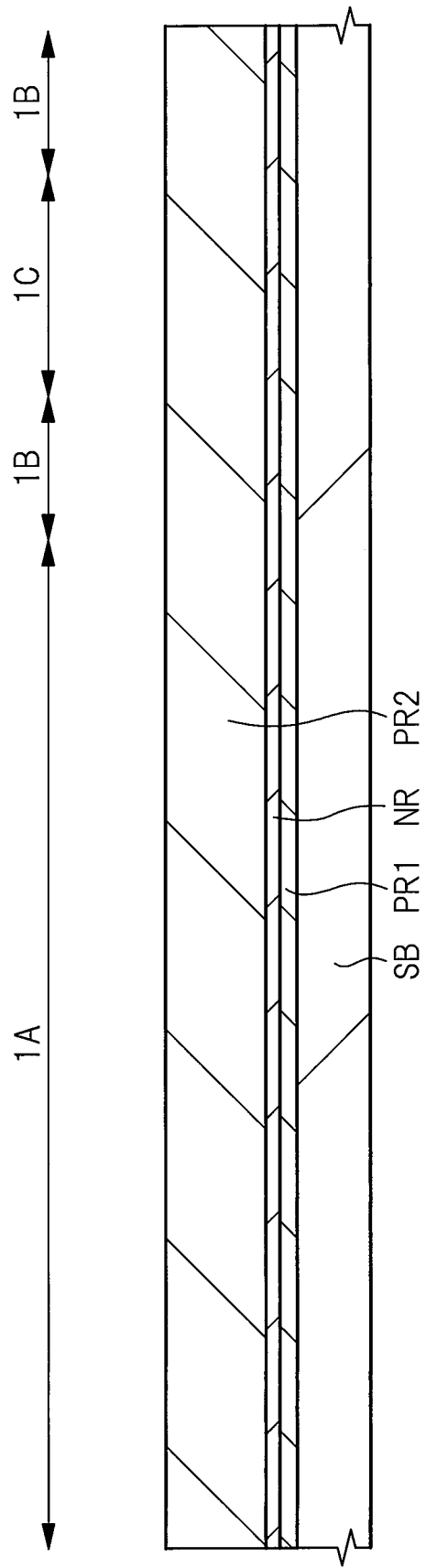
FIG. 5 is a cross-sectional view showing a manufacturing process of the semiconductor device according to the first embodiment of the present invention.

In the manufacturing process of the semiconductor device, the p-type semiconductor substrate SB made of, for example, single crystal silicon (Si), that is, the semiconductor wafer WF is first prepared as shown in FIGS. 1 and 5. The semiconductor substrate SB includes the main surface serving as a first surface on which semiconductor elements such as a photodiode and a transistor are formed in the latter process and a rear surface (back surface) serving as a second surface on the opposite side. The epitaxial layer having a p-type impurity concentration lower than that of the semiconductor substrate SB is formed on the semiconductor substrate SB. The epitaxial layer is a p-type semiconductor layer formed by the epitaxial growth method. The semiconductor substrate SB and the epitaxial layer constitute the stacked substrate.

Then, the n-type buried region NR is formed at an intermediate depth of the epitaxial layer by implanting an n type impurity into the epitaxial layer by, for example, the ion implantation method. The epitaxial layer below the n-type buried region NR is the p-type semiconductor region PR1. Subsequently, the p-type semiconductor region PR2 is formed in the epitaxial layer from the upper surface of the epitaxial layer to the upper portion of the n-type buried region NR by implanting a p-type impurity into the epitaxial layer by, for example, the ion implantation method. Thus, the p-type semiconductor region PR1, the n-type buried region NR, and the p-type semiconductor region PR2 are sequentially formed on the semiconductor substrate SB. The impurity concentrations of the p-type semiconductor regions PR1 and PR2 are lower than that of the semiconductor substrate SB.

Figure 6:
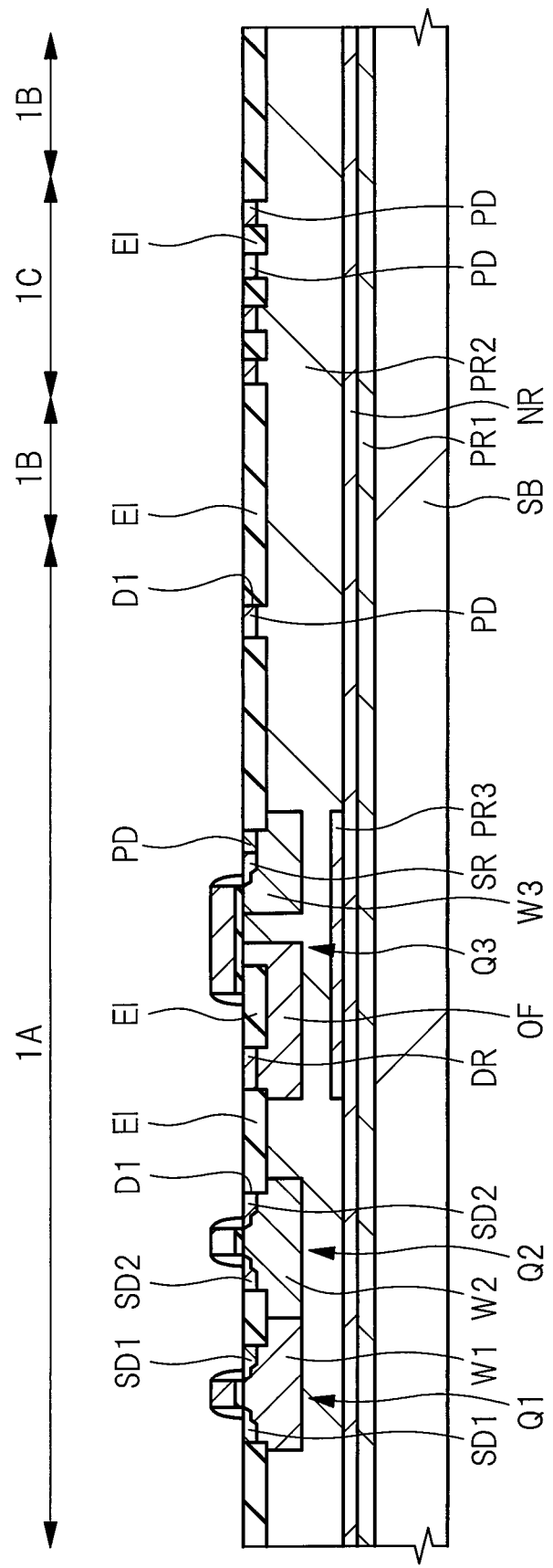
FIG. 6 is a cross-sectional view showing the manufacturing process of the semiconductor device continued from FIG. 5.

Next, as shown in FIG. 6, the plurality of trenches D1 are formed in the upper surface of the p-type semiconductor region PR2 by the dry etching method using a hard mask (not shown). Then, the element isolation region EI made of an insulating film buried in each of the trenches D1 is formed. The element isolation region EI is made of, for example, a silicon oxide film, and has the STI structure. Herein, the plurality of element isolation regions EI are formed in each of the circuit region 1A, the seal ring region 1B, and the scribe region 1C.

Then, the n-type well W1 is formed in the upper surface of the p-type semiconductor region PR2 by implanting the n-type impurity into the upper surface of the p-type semiconductor region PR2 of the circuit region 1A by, for example, the ion implantation method, and the p-type well W2 is formed in the upper surface of the p-type semiconductor region PR2 by implanting the p-type impurity into the upper surface of the p-type semiconductor region PR2 of the circuit region 1A by, for example, the ion implantation method. In addition, the n-type offset region OF and the p-type well W3 are formed in the upper surface of the p-type semiconductor region PR2 by implanting the p-type impurity and the n-type impurity into the upper surface of the p-type semiconductor region PR2 of the circuit region 1A by, for example, the ion implantation method. Further, the p-type impurity is implanted onto the n-type buried region NR of the region where the n-type offset region OF and the p-type well W3 are formed, that is, a high breakdown voltage transistor forming region by, for example, the ion implantation method, thereby forming the p-type buried region PR3. Heat treatment is performed in, for example, a nitrogen atmosphere every time after the ion implantation processes for forming the n-type well W1, the n-type offset region OF, and the p-type wells W2 and W3 are performed.

Thereafter, the p-type low breakdown voltage transistor Q1 is formed on the n-type well W1, the n-type low breakdown voltage transistor Q2 is formed on the p-type well W2, and the n-type high breakdown voltage transistor Q3 is formed on the p-type semiconductor region PR2 where the n-type offset region OF and the p-type well W3 are formed. Since these transistors do not have the main features of the present embodiment, the manufacturing process of the transistors will be simply described below.

In the forming process of these transistors, first, a gate insulating film configured of a silicon oxide film, a silicon nitride film, or a stacked film thereof is formed on the upper surface of the stacked substrate by, for example, the thermal oxidation method. Next, a plurality of gate electrodes are formed on the gate insulating film. As the gate electrodes, for example, a polysilicon film is deposited by, for example, the CVD (Chemical Vapor Deposition) method, and then the polysilicon film is separated into an n type and a p type by the ion implantation method or the like. Thereafter, the polysilicon film and the gate insulating film are processed in a desired pattern by using the photolithography technique and the dry etching method. In this manner, various gate electrodes made of the polysilicon film are formed.

Then, the pair of source-drain regions SD1 made of the p-type semiconductor region is formed by implanting the p type impurity into the upper surface of the n-type well W1 by the ion implantation method or the like. In addition, the pair of source-drain regions SD2 made of the n-type semiconductor region is formed by implanting the n type impurity into the upper surface of the p-type well W2 by the ion implantation method or the like. Further, the drain region DR made of the n-type semiconductor region is formed by implanting the n-type impurity into the upper surface of the n-type offset region OF by the ion implantation method or the like, and the source region SR made of the n-type semiconductor region is formed by implanting the n-type impurity into the upper surface of the p-type well W3 by the ion implantation method or the like. Also, the p-type diffusion region PD made of the p-type semiconductor region is formed by implanting the p-type impurity into the upper surface of the p-type well W3 adjacent to the source region SR by the ion implantation method or the like.

In addition, the p-type diffusion region PD made of the p-type semiconductor region is formed on the upper surface of the p-type semiconductor region PR2 exposed from the element isolation region EI in the seal ring region 1B and the scribe region 1C. Heat treatment is performed in a nitrogen atmosphere every time after the ion implantation processes for forming the source-drain regions SD1 and SD2, the source region SR, the drain region DR, and the p-type diffusion region PD are performed.

Herein, each of the source-drain regions SD1 and SD2 and the source region SR is made up of the extension region and the diffusion region which are separately formed by two steps of implantation process. The extension region has a lower impurity concentration, is positioned on a side closer to the gate electrode constituting a transistor, and has a shallower depth compared to the diffusion region. Through the process described above, the p-type low breakdown voltage transistor Q1 which includes the source-drain regions SD1 and the gate electrode on the n-type well W1, the n-type low breakdown voltage transistor Q2 which includes the source-drain regions SD2 and the gate electrode on the p-type well W2, and the n-type high breakdown voltage transistor Q3 which includes the source region SR, the drain region DR, and the gate electrode can be formed. Note that, after the extension region is formed, the sidewalls made of an insulating film covering the side surfaces of each gate electrode are formed before the diffusion region is formed.

Figure 7:
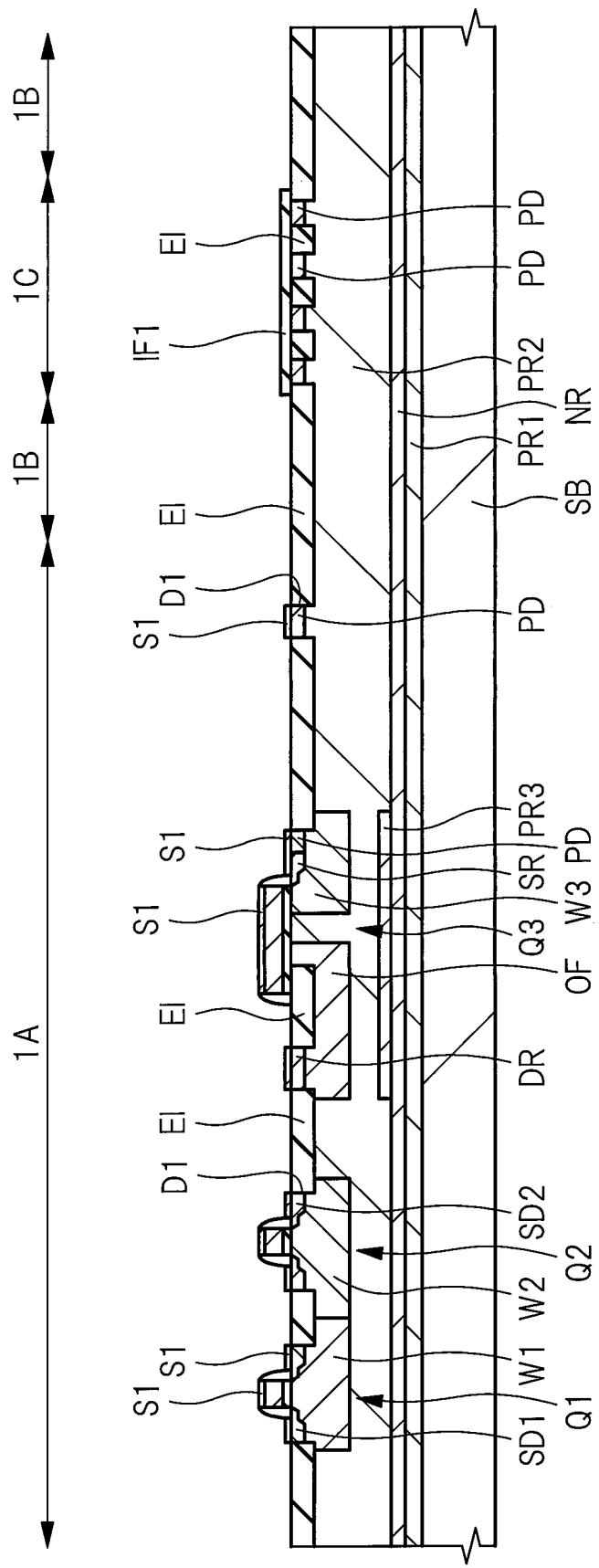
FIG. 7 is a cross-sectional view showing the manufacturing process of the semiconductor device continued from FIG. 6.

Next, as shown in FIG. 7, the silicide layer S1 which covers each of the surfaces of the exposed diffusion regions and the exposed gate electrodes is formed by performing a well-known salicide process. Namely, first, the upper surface of the p-type diffusion region PD exposed in the scribe region 1C and the upper surface of the element isolation region EI of the scribe region 1C are covered with the insulating film IF1 in order to prevent the silicide layer S1 from being formed in the scribe region 1C. The insulating film IF1 is formed by, for example, the CVD method, and is a silicide protection film made of, for example, a silicon oxide film or a silicon nitride film.

Then, a metal film made of Co (cobalt) or Ni (nickel) is formed over the entire surface of the semiconductor substrate SB by, for example, the sputtering method. A film thickness of the metal film is, for example, about several tens nm. Thereafter, the stacked substrate is heated to about 500° C. to react silicon and the metal film, thereby forming the silicide layer S1. Subsequently, the silicide layers formed on the insulating film IF1, the element isolation region EI, and the sidewall are removed by performing the wet etching method using mixture solution of sulfuric acid and hydrogen peroxide. Thereafter, heat treatment is further performed at about 800° C. to form the desired silicide layers S1 only on the surfaces of the diffusion regions and the gate electrodes.

Figure 8:
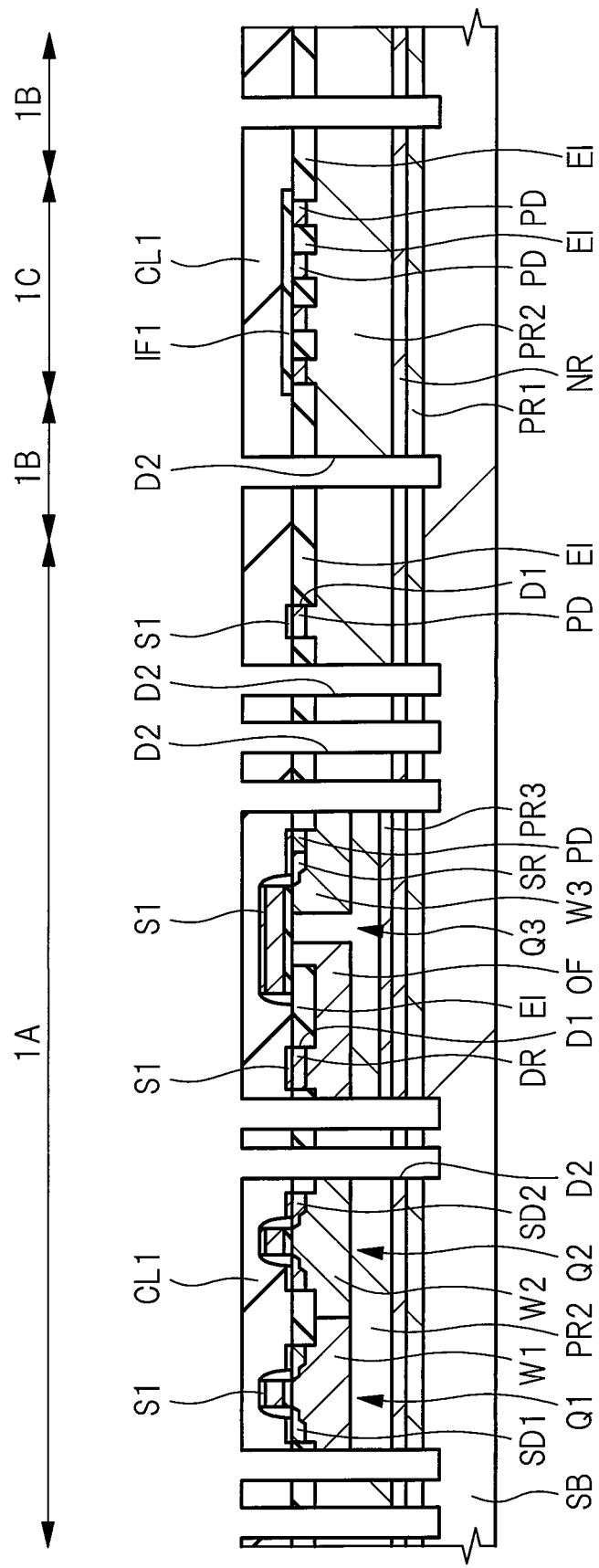
FIG. 8 is a cross-sectional view showing the manufacturing process of the semiconductor device continued from FIG. 7.

Next, as shown in FIG. 8, an interlayer insulating film (contact interlayer film) CL1 configured of a silicon nitride film, a silicon oxide film, or a stacked film thereof is formed by, for example, the CVD method. Thereafter, the upper surface of the interlayer insulating film CL1 is planarized by performing a planarization process by the CMP (Chemical Mechanical Polishing) method. Then, the tranches D2 are formed by processing the interlayer insulating film CL1, the element isolation region EI, the epitaxial layer, and the semiconductor substrate SB by a patterning process using the photolithography technique and the dry etching method. Herein, the trenches D2 are formed not only in the place where the DTI structure is formed later but also in the place where the substrate contact plug is formed later. Namely, the plurality of trenches D2 include trenches for forming the DTI structure and trenches for forming the substrate contact plug.

The trench D2 is a deep concave portion which penetrates the interlayer insulating film CL1, the element isolation region EI, and the epitaxial layer, and reaches an intermediate depth of the semiconductor substrate SB. Herein, the trench D2 is not formed in the scribe region 1C, but is formed in the circuit region 1A and the seal ring region 1B. A width in the lateral direction of the trench D2 is, for example, 0.8 nm. Note that, after the trenches D2 are formed, the p-type semiconductor region may be formed at the bottom of the trenches D2 by the ion implantation method for the purpose of improving an isolation breakdown voltage.

Figure 9:
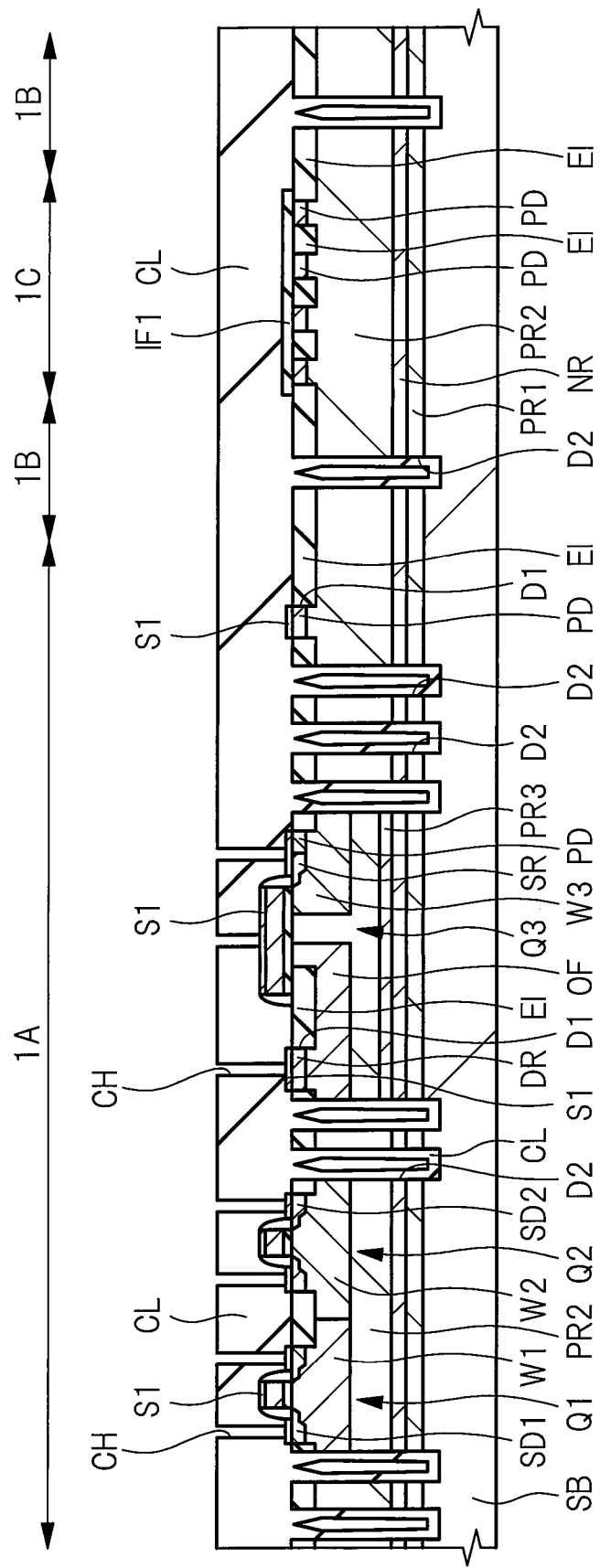
FIG. 9 is a cross-sectional view showing the manufacturing process of the semiconductor device continued from FIG. 8.

Next, as shown in FIG. 9, an insulating film (interlayer insulating film) made of a silicon oxide film is further formed (deposited) over the interlayer insulating film CL1 by the CVD method or the like. Thus, the interlayer insulating film CL made up of the interlayer insulating film CL1 and the insulating film thereon is formed. Herein, the insulating film is formed to cover the trenches D2 with the insulating film. Thereafter, the upper surface of the interlayer insulating film CL is planarized by the CMP method or the like. In FIG. 9, the interlayer insulating film CL1 and the insulating film formed thereon are illustrated as an integrated film, and the boundary therebetween is not shown.

Then, the plurality of contact holes (connection holes) CH penetrating the interlayer insulating film CL are formed by the patterning process using the photolithography technique and the dry etching method. In the deposition process of the insulating film described above, the insulating film is deposited on the side surface and the bottom surface of each trench D2, but the inside of the trench D2 is not completely buried with the insulating film and becomes partially hollow. Namely, the void is formed in the trench D2 via the interlayer insulating film CL. The interlayer insulating film CL and the voids in the trenches D2 different from the trenches D2 in which the substrate contact plugs are formed in the latter process constitute the DTI structure used for the element isolation.

Each of the plurality of contact holes CH exposes, at the bottom thereof, the silicide layer S1 on the upper surface of each of the gate electrode of the p-type low breakdown voltage transistor Q1, the gate electrode of the n-type low breakdown voltage transistor Q2, the gate electrode of the n-type high breakdown voltage transistor Q3, the source-drain regions SD1 and SD2, the source region SR, and the drain region DR. Each of the contact holes CH is, for example, a circular hole portion in plan view, and an average diameter thereof is, for example, 0.1 μm. Herein, the contact hole CH is not formed in the scribe region 1C and the seal ring region 1B, but is formed only in the circuit region 1A.

Figure 10:
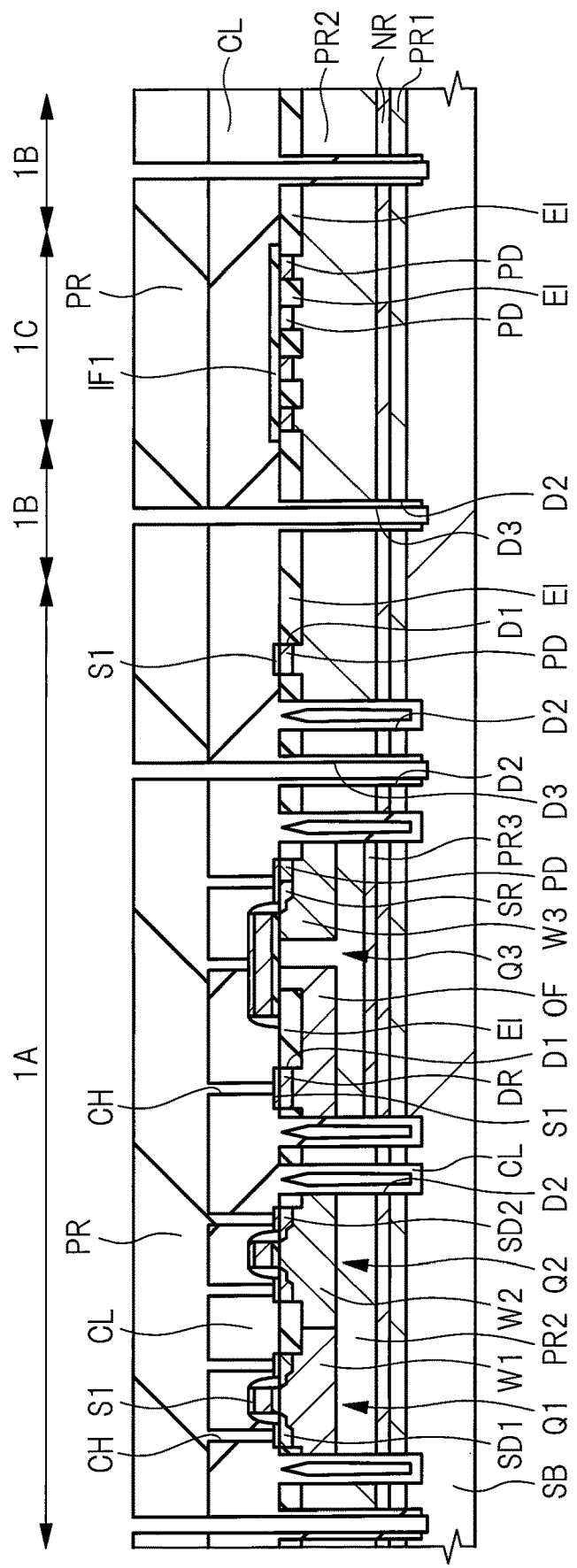
FIG. 10 is a cross-sectional view showing the manufacturing process of the semiconductor device continued from FIG. 9.

Next, as shown in FIG. 10, the trenches (substrate contact trenches) D3 which penetrate the interlayer insulating film CL are formed by performing the patterning process using the photolithography technique and the dry etching method. Namely, a photoresist film PR which is a resist pattern is first formed over the interlayer insulating film CL including the inside of each contact hole CH. In other words, the photoresist film PR is completely buried in all the contact holes CH, and covers the upper surface of the interlayer insulating film CL. In addition, the photoresist film PR is a pattern which exposes the upper surface of the interlayer insulating film CL immediately above some of the trenches D2. Specifically, the photoresist film PR has openings only at the places where the substrate contact plugs are formed, and the upper surface of the interlayer insulating film CL is exposed at the bottom of each opening.

Then, the trenches D3 penetrating the interlayer insulating film CL, the element isolation region EI, and the epitaxial layer and reaching an intermediate depth of the semiconductor substrate SB below the bottom surface of the trench D2 are formed by the dry etching method using the photoresist film PR as an etching mask. Herein, the interlayer insulating film CL is first gradually etched and removed from the upper surface toward the lower side, and the trench D3 reaches the void in the trench D2. Thus, the void in the trench D2 becomes a part of the trench D3. Thereafter, the upper surface of the semiconductor substrate SB is exposed at the bottom of the trench D3 by removing the interlayer insulating film CL at the bottom of the trench D2, the silicon oxide film and the silicon nitride film left at the bottom by the dry etching method or the like. In this manner, the trenches D3 reaching the semiconductor substrate SB from the upper surface of the interlayer insulating film CL are formed. Note that, after opening the trenches D3, the p-type impurity may be implanted to the bottom of each trench D3 in order to reduce resistance.

Herein, the trench D3 is not formed in the scribe region 1C, but is formed in the circuit region 1A and the seal ring region 1B. For example, the trench D3 is a pattern extending in the horizontal direction along the main surface of the semiconductor substrate SB, and a width in the transverse direction of the trench D3 is, for example, 0.5 μm. In addition, the trenches D2 and D3 of the seal ring region 1B have a long annular pattern extending along four sides of a rectangular chip forming region in plan view. Therefore, since the trench D3 having the annular pattern is formed in the seal ring region 1B in addition to the trench D3 of the circuit region 1A, an opening ratio of the trenches D3 of the entire semiconductor wafer at the time when the trenches D3 are formed by the process described with reference to FIG. 11 becomes significantly larger compared to a case where the trench D3 is not formed in the seal ring region 1B.

Figure 11:
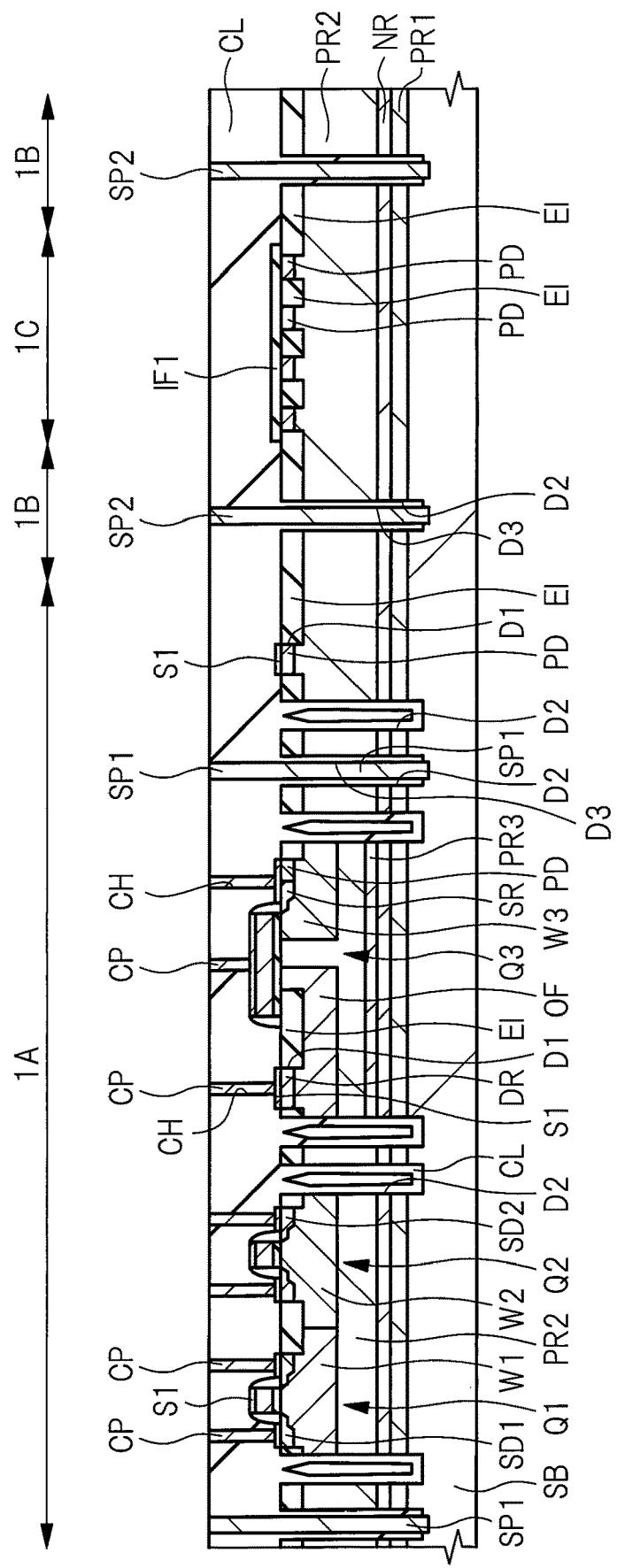
FIG. 11 is a cross-sectional view showing the manufacturing process of the semiconductor device continued from FIG. 10.

Next, as shown in FIG. 11, after removing the photoresist film PR, the contact plug (conductive connection portion) CP is formed in each of the contact holes CH, and the substrate contact plug (substrate connection portion) SP1 or SP2 is formed in each of the trenches D3. Namely, a barrier metal film configured of, for example, a Ti (titanium) film, a TiN (titanium nitride) film, or a stacked film thereof is deposited over the entire main surface of the semiconductor substrate SB by the sputtering method or the like. Thereafter, the inside of the contact holes CH and the trenches D3 is completely buried by forming a film (main conductor film) having, for example, W (tungsten) as a main component by the CVD method or the like. Then, the upper surface of the interlayer insulating film CL is exposed by removing the superfluous metal film on the interlayer insulating film CL by the CMP method.

In this manner, the contact plug CP made up of the barrier metal film and the main conductor film is formed in each of the contact holes CH, and the substrate contact plug SP1 or SP2 made up of the barrier metal film and the conductor film is formed in each of the trenches D3. The substrate contact plug SP1 is a conductor film formed in the trench D3 of the circuit region 1A, and the substrate contact plug SP2 is a conductor film formed in the trench D3 of the seal ring region 1B. Each of the substrate contact plugs SP1 and SP2 has the lower surface connected to the semiconductor substrate SB and the upper surface planarized to be substantially flush with the upper surface of the interlayer insulating film CL. Note that the contact plug CP and the substrate contact plugs SP1 and SP2 are not formed in the scribe region 1C. In addition, the contact plug CP is not formed in the seal ring region 1B.

Figure 12:
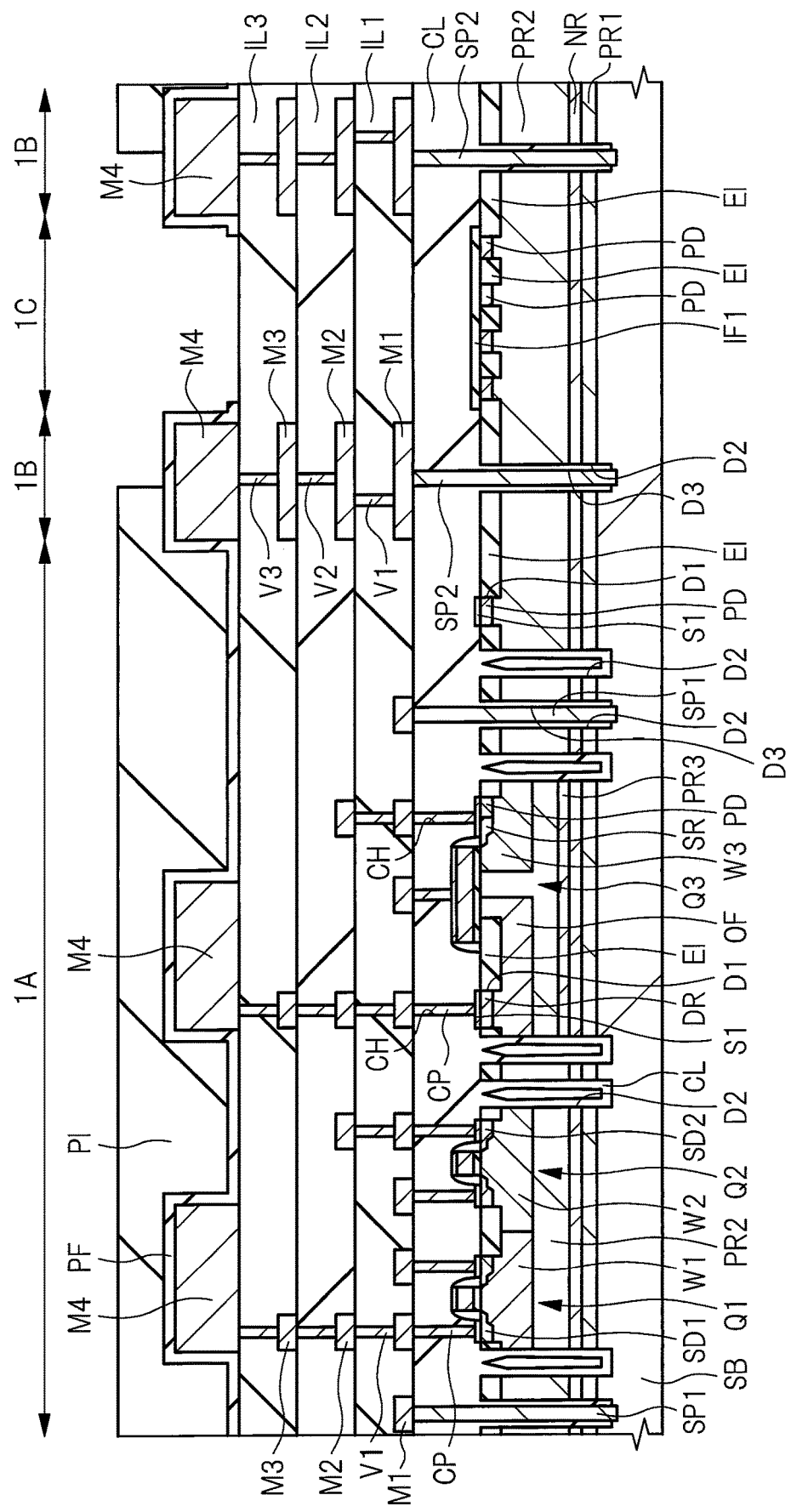
FIG. 12 is a cross-sectional view showing the manufacturing process of the semiconductor device continued from FIG. 11.

Next, as shown in FIG. 12, the barrier metal film configured of, for example, a Ti (titanium) film, a TiN (titanium nitride) film, or a stacked film thereof and the main conductor film made of an aluminum film are stacked on each of the interlayer insulating film CL, the contact plug CP, and the substrate contact plugs SP1 and SP2. Then, the plurality of wirings M1 made up of the barrier metal film and the main conductor film are formed by the photolithography technique and the etching method. A part of the lower surface of the wiring M1 is connected to the upper surface of each of the contact plug CP and the substrate contact plug SP1 or SP2. However, the wiring M1 formed in the circuit region 1A is not connected to the substrate contact plug SP2 of the seal ring region 1B.

Then, the interlayer insulating film IL1 configured of, for example, a silicon oxide film, a silicon nitride film, or a stacked film thereof is formed over the interlayer insulating film CL so as to cover the wirings M1. Thereafter, the upper surface of the interlayer insulating film IL1 is planarized by, for example, the CMP method.

Then, via holes that penetrate the interlayer insulating film IL1 and expose the upper surfaces of the wirings M1 are formed by the photolithography technique and the dry etching method. Thereafter, the barrier metal film configured of, for example, a Ti (titanium) film, a TiN (titanium nitride) film, or a stacked film thereof is deposited by the sputtering method or the like, and then a film (main conductor film) having W (tungsten) as a main component is formed by the CVD method or the like, thereby burying the via holes. Thereafter, the vias V1 made up of the barrier metal film and the main conductor film in the via holes are formed by removing the superfluous barrier metal film and main conductor film on the interlayer insulating film IL1 by the CMP method to expose the upper surface of the interlayer insulating film IL1. In this manner, the first wiring layer including the wirings M1, the interlayer insulating film IL1, and the vias V1 is formed.

Then, the second wiring layer and the third wiring layer are sequentially formed on the first wiring layer through the same processes as those of the first wiring layer. Thereafter, the wirings M4 are formed on the third wiring layer by the same method as the forming method the wirings M1. The wirings M1 to M4, the vias V1 to V3, and the contact plugs CP which are formed in the circuit region 1A are electrically connected to the semiconductor elements formed on the stacked substrate. In addition, the wirings M1 to M4 and the vias V1 to V3 which are formed in the seal ring region 1B are electrically connected to the semiconductor substrate SB through the substrate contact plug SP2.

However, the wirings M1 to M4, the vias V1 to V3, and the contact plugs CP which are formed in the circuit region 1A are not electrically connected to the wirings M1 to M4, the vias V1 to V3, and the substrate contact plug SP2 which are formed in the seal ring region 1B. Namely, the wirings M1 to M4, the vias V1 to V3, and the substrate contact plug SP2 which are formed in the seal ring region 1B do not form a circuit.

Then, the passivation film PF and the polyimide film PI which cover the wirings M4 are sequentially formed, and the passivation film PF and the polyimide film PI of the scribe region 1C are removed by performing the patterning process. In this manner, the upper surface of the interlayer insulating film IL3 of the scribe region 1C is exposed. Thus, the semiconductor device of the present embodiment is almost completed.

Thereafter, the dicing process is performed to divide the semiconductor wafer WF (see FIG. 1) into individual pieces, so that the plurality of semiconductor chips CHP (see FIG. 3) configured of the chip region CHR (see FIG. 1) can be obtained. In the dicing process, the scribe region 1C is cut out by the dicing blade. At this time, the seal ring made up of the wirings M1 to M4, the vias V1 to V3, and the substrate contact plug SP2 formed in the seal ring region 1B functions to prevent the semiconductor wafer from being broken (chipping). In addition, the seal ring has a function to prevent moisture from entering the circuit region 1A from the side surface of the semiconductor chip CHP obtained by the dicing process, and to prevent metallic contamination of the circuit region 1A.

Therefore, in order to protect the circuit region 1A by the seal ring, the wirings, the vias, and the substrate contact plug SP2 constituting the seal ring are formed in an annular shape along the outer periphery of the semiconductor chip CHP (see FIG. 3). In addition, in order to protect the circuit region 1A by the seal ring, the wirings M1 to M4, the vias V1 to V3, and the substrate contact plug SP2 of the seal ring region 1B are formed to be overlapped in a direction perpendicular (vertical) to the main surface of the semiconductor substrate SB as far as possible. Note that, in a case where irregularities are formed on the upper surface of the wiring M1 immediately above the substrate contact plug SP2, the via V1 connected to the upper surface of the wiring M1 may be formed at a position shifted in the lateral direction from the position immediately above the substrate contact plug SP2.

Effects of Present Embodiment

Figure 31:
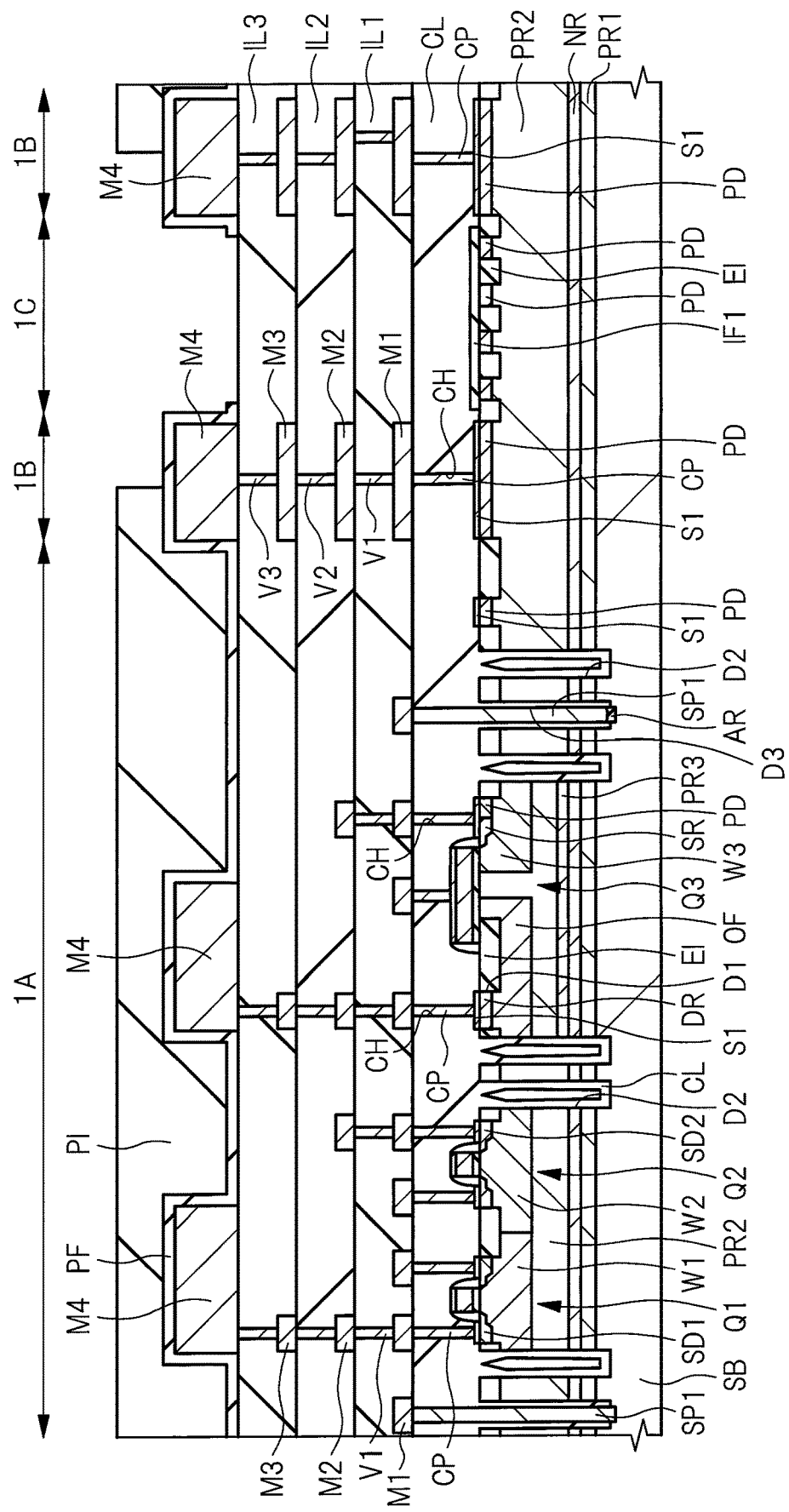
FIG. 31 is a cross-sectional view for describing a semiconductor device according to a comparative example.

Hereinafter, the effects of the present embodiment will be described with reference to FIG. 31 shown as a comparative example. FIG. 31 is a cross-sectional view of a semiconductor device according to the comparative example, and the circuit region 1A, the seal ring region 1B, and the scribe region 1C corresponding to those of FIG. 4 are illustrated in FIG. 31.

The semiconductor device of the comparative example is different from that of the present embodiment in that the substrate contact plug is not formed in the seal ring region 1B and the contact plug CP formed below the wiring M1 of the seal ring region 1B is connected to the upper surface of the epitaxial layer, the upper surface of the silicide layer S1, or the upper surface of the element isolation region EI. In FIG. 31, the contact plug CP is connected to the upper surface of the silicide layer S1 formed on the upper surface of the epitaxial layer, and is not buried in the trench formed in the upper surface of the stacked substrate. In addition, the contact plug CP of the comparative example is not formed by burying a conductive film in the opening formed in the forming process of the substrate contact plug (see FIG. 10), and the comparative example is different in this point from the present embodiment in which the substrate connection portion formed in the trench D3 which is the opening formed in the process described with reference to FIG. 10 is formed in the seal ring region 1B.

In the semiconductor device, it is essential to make the characteristics of the transistors constituting the semiconductor device and the characteristics of passive elements such as a resistor and a capacitor fall within a certain standard range in order to secure a high yield of the semiconductor wafer. On the other hand, the number of substrate contact plugs disposed in the circuit region of the semiconductor device changes depending on requirements and necessities of each semiconductor device. Therefore, an area occupied by the trenches in which the substrate contact plugs are formed in an individual chip (semiconductor chip) and an opening ratio indicating a ratio of an area of the trenches in plan view to the area of the individual chip also change for each semiconductor device.

Herein, the inventors have examined the resistance values of the substrate contact plugs of the plurality of semiconductor devices, and found out that the resistance values have dependency on the opening ratio of the trench for the substrate contact plug (hereinafter, referred to as substrate contact opening ratio), and a problem that the resistance value increases and exceeds a standard upper limit occurs in the vicinity of the center of the semiconductor wafer where the opening ratio becomes small. This is probably because, when the substrate contact opening ratio is small in the dry etching process for opening the trench for the substrate contact plug, an altered layer due to polymer generated by the dry etching is formed at the bottom of the trench for the substrate contact plug.

Namely, in a case where the number of substrate contact plugs and the area thereof formed in the semiconductor device are small and the substrate contact opening ratio is small, the formation and the removability of the polymer change compared with a case where the opening ratio is large, and there is a high possibility that an insulating altered layer is intensively formed at the bottoms of some of the trenches for substrate contact plugs. In this case, since the altered layer is interposed between the substrate contact plug buried in the trench and the semiconductor substrate, the resistance value of the substrate contact plug increases. In the comparative example shown in FIG. 31, the substrate contact plugs SP1 are formed only in the circuit region 1A, and thus the substrate contact opening ratio when the trenches D3 are formed is small. Therefore, an altered layer AR is formed at the bottoms of some of the trenches D3, and the altered layer AR hinders the electrical connection between the substrate contact plug SP1 and the semiconductor substrate SB.

As one of the measures to solve this problem, it is conceivable to increase the substrate contact opening ratio of each semiconductor device to be equal to or more than a certain level. However, the number of required substrate contact plugs differs for each semiconductor device. Therefore, in the semiconductor device in which the substrate contact plug is almost unnecessary, it is necessary to take measures to additionally dispose a dummy pattern of the substrate contact plug in the circuit region. However, in a case where the dummy pattern is additionally disposed, there is a need to secure an area for disposing the dummy pattern, and it is also necessary to dispose a wiring on the substrate contact plug. Accordingly, there arise a problem that a chip area is unnecessarily increased and a problem that the degree of freedom in the layout of metal wirings is decreased.

With this regard, in the present embodiment, the substrate contact plug SP2 is formed in the seal ring region 1B as shown in FIG. 4, so that the substrate contact opening ratio in the dry etching process (see FIG. 10) for forming the trenches D3 in which the substrate contact plugs SP1 and SP2 are buried can be increased. Therefore, the formation or the removability of the polymer to be a cause of occurrence of the altered layer can be improved, and it is thus possible to prevent the altered layer from being formed at the bottom of the trench D3 of the circuit region 1A. In addition, even if the altered layer is formed at the bottom of the trench D3 of the circuit region 1A, the amount of the altered layer to be formed can be reduced, so that the increase of the resistance value of the substrate contact plug SP1 can be suppressed. Therefore, it is possible to improve the reliability of the semiconductor device.

Further, in the present embodiment, the substrate contact plug SP2 is formed below the seal ring which is provided for the purpose of the prevention of chipping, moisture, and metallic contamination, and thus the area of the semiconductor device is not increased. Namely, since there is no need to dispose the dummy pattern of the substrate contact plug SP1 which does not form a circuit in the circuit region 1A, it is possible to prevent the unnecessary increase of the chip area and the decrease of the degree of freedom in the layout of metal wirings. Therefore, the performance of the semiconductor device can be improved.

In addition, since the substrate contact opening ratio is increased when the number of substrate contact plugs SP2 is larger, the effects described above can be obtained more remarkably. However, since the seal ring region 1B is a region having a relatively large area disposed along the peripheral portion of the semiconductor chip, the opening ratio almost enough to prevent the occurrence of high resistance failure can be obtained only by forming one annular substrate contact plug SP2 along the seal ring region 1B. Namely, the effects described above can be obtained even when there is only one substrate contact plug SP2 formed in the seal ring region 1B as shown in FIGS. 3 and 4.

<First Modification>

Figure 13:
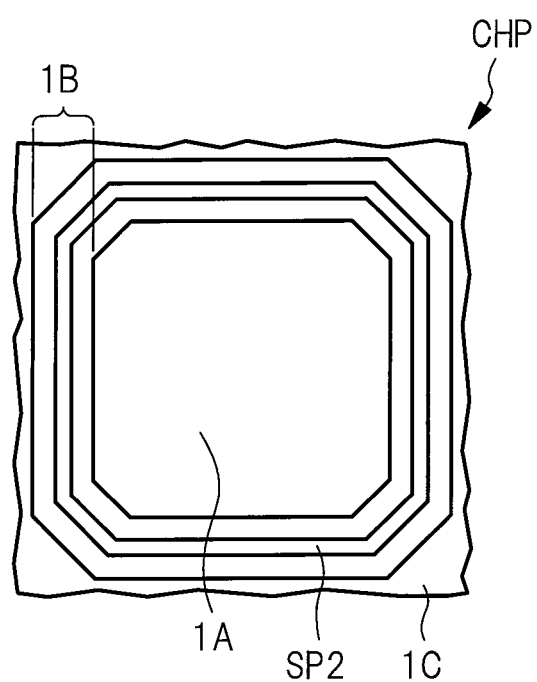
FIG. 13 is a plan view for describing a semiconductor device according to a first modification of the first embodiment of the present invention.

FIG. 13 shows a plan view for describing a semiconductor device according to a first modification of the first embodiment. As shown in FIG. 13, the corners of the seal ring region 1B in plan view are not necessarily formed at right angles, and the seal ring region 1B may be formed to have chamfered corners. Namely, the substrate contact plug SP2 and the wirings M1 to M4 and the vias V1 to V3 of the seal ring region 1B shown in FIG. 4 may be formed into a polygonal annular shape in plan view.

<Second Modification>

Figure 14:
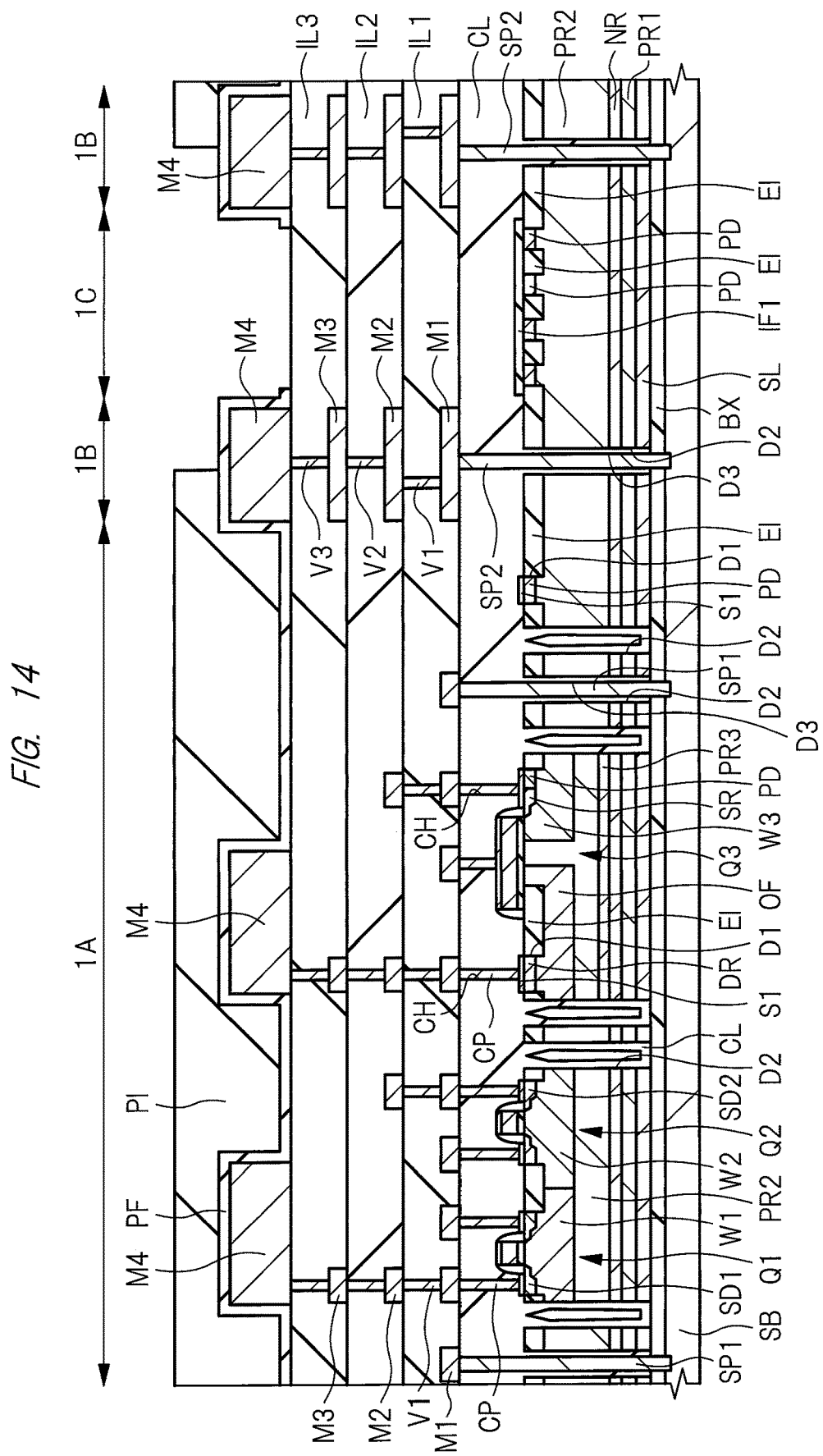
FIG. 14 is a cross-sectional view for describing a semiconductor device according to a second modification of the first embodiment of the present invention.

FIG. 14 shows a cross-sectional view for describing a semiconductor device according to a second modification of the first embodiment. As shown in FIG. 14, the semiconductor device of the present embodiment may be formed on an SOI (Silicon On Insulator) substrate. Herein, a BOX (Buried Oxide) layer BX is formed on the semiconductor substrate SB, a semiconductor layer (SOI layer) SL is formed on the BOX layer BX, and an epitaxial layer is formed on the semiconductor layer SL. For example, the trenches D2 reach the upper surface of the BOX layer BX but do not reach the semiconductor substrate SB, and the trenches D3 penetrate the BOX layer BX to reach an intermediate depth of the semiconductor substrate SB. The interlayer insulating film CL is interposed between the semiconductor layer SL and the substrate contact plugs SP1 and SP2, and the substrate contact plugs SP1 and SP2 are connected to the semiconductor substrate SB.

Even in the semiconductor device having such an SOI structure, the effects of the present embodiment described above can be obtained.

<Third Modification>

Figure 15:
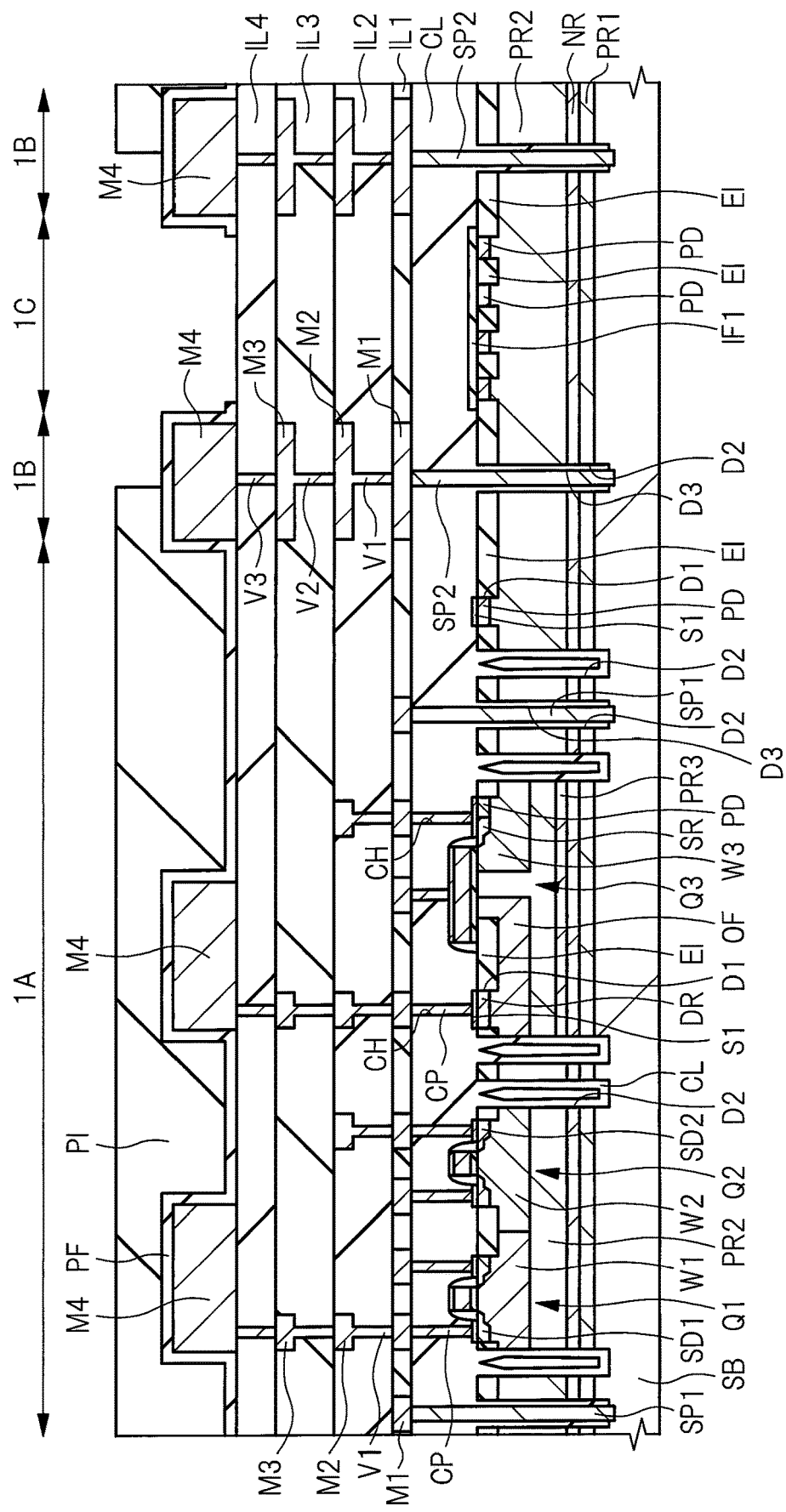
FIG. 15 is a cross-sectional view for describing a semiconductor device according to a third modification of the first embodiment of the present invention.

FIG. 15 shows a cross-sectional view for describing a semiconductor device according to a third modification of the first embodiment. As shown in FIG. 15, each wiring of the semiconductor device of the present embodiment may be formed by a so-called damascene method.

Herein, the first wiring layer is configured of the interlayer insulating film IL1 on the interlayer insulating film CL and the wirings M1 formed in wiring trenches which penetrate the interlayer insulating film IL1. The wiring M1 can be formed by a so-called single damascene method. Namely, after the process described with reference to FIG. 11, the interlayer insulating film IL1 is formed on the interlayer insulating film CL, and the wiring trenches are formed by processing the interlayer insulating film IL1, thereby exposing the contact plugs CP and the substrate contact plug SP1 or SP2 at the bottoms of the wiring trenches. Then, after the wirings M1 mainly made of a Cu (copper) film are buried in the wiring trenches, the upper surface of the interlayer insulating film IL1 is planarized by the CMP method, thereby forming the first wiring layer.

Next, the second wiring layer including the interlayer insulating film IL2, the wirings M2, and the vias V1 is formed on the first wiring layer. The second wiring layer is formed by, for example, a so-called dual damascene method. Namely, after the interlayer insulating film IL2 is formed on the first wiring layer by the CVD method or the like, wiring trenches are formed in the upper surface of the interlayer insulating film IL2, and the via holes which reach the upper surfaces of the wirings M1 from the bottom surfaces of the wiring trenches are formed. Thereafter, the wirings M2 in the wiring trenches and the vias V1 in the via holes are formed by burying the wiring trenches and the via holes with a metal film mainly made of a copper film.

Thereafter, the third wiring layer is formed on the second wiring layer by the process similar to that of the forming process of the second wiring layer. Then, a connection layer is formed on the third wiring layer. The connection layer includes an interlayer insulating film IL4 made of, for example, a silicon oxide film and the vias V3 which penetrate the interlayer insulating film IL4. The vias V3 are formed by burying a metal film mainly made of a copper film in the via holes formed by processing the interlayer insulating film IL4. The vias V3 are connected to the bottom surfaces of the wirings M4 which are formed on the connection layer.

In this manner, the effects of the present embodiment described above can be obtained even in the semiconductor device in which the wirings and others are formed by the damascene method. In addition, when the wirings M1 are formed by the damascene method, the upper surfaces of the wirings M1 can be planarized by the CMP method. Therefore, it is possible to form the via V1 immediately above the substrate contact plug SP2. Accordingly, it is also possible to reduce a width of the seal ring region 1B.

Second Embodiment

Figure 16:
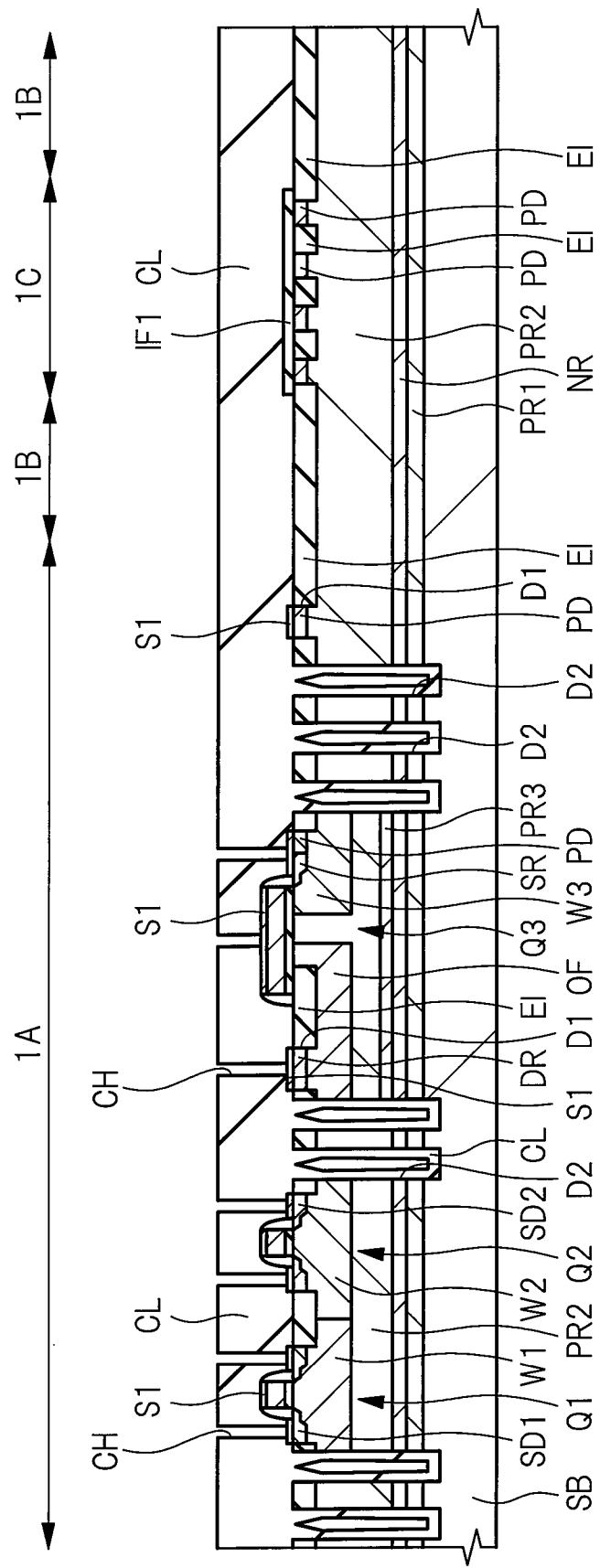
FIG. 16 is a cross-sectional view for describing a manufacturing process of a semiconductor device according to a second embodiment of the present invention.
Figure 17:
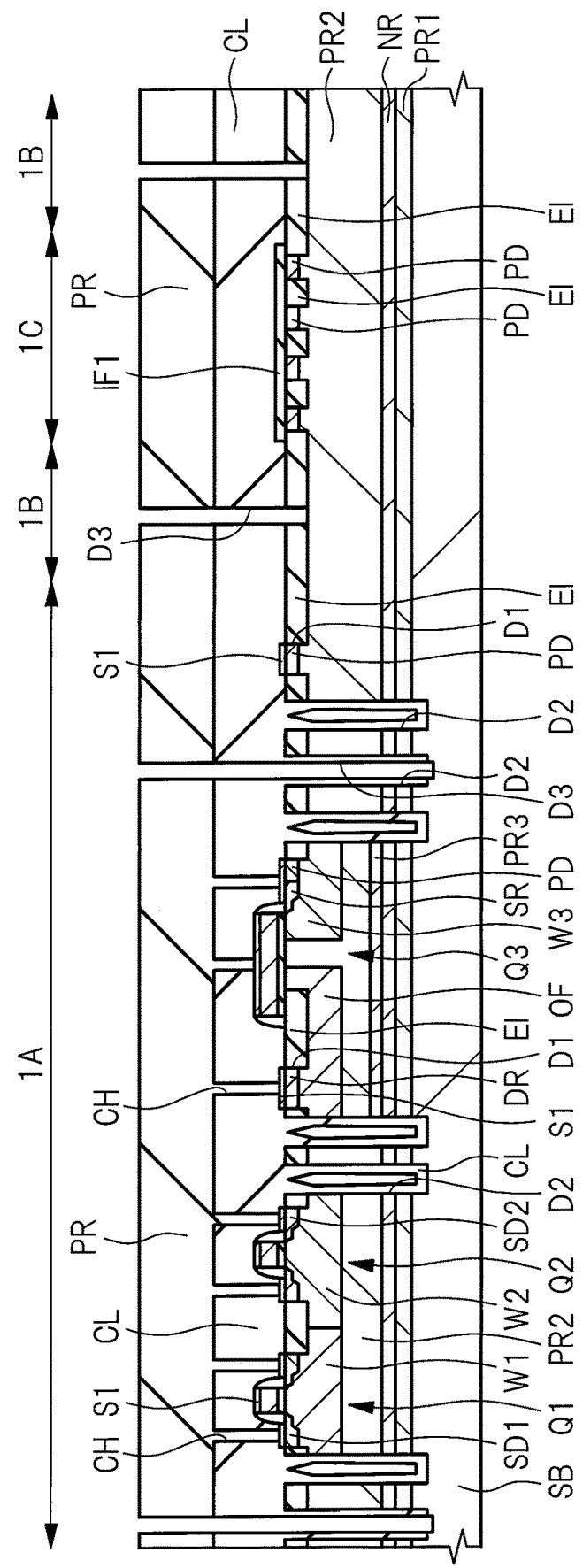
FIG. 17 is a cross-sectional view showing the manufacturing process of the semiconductor device continued from FIG. 16.
Figure 18:
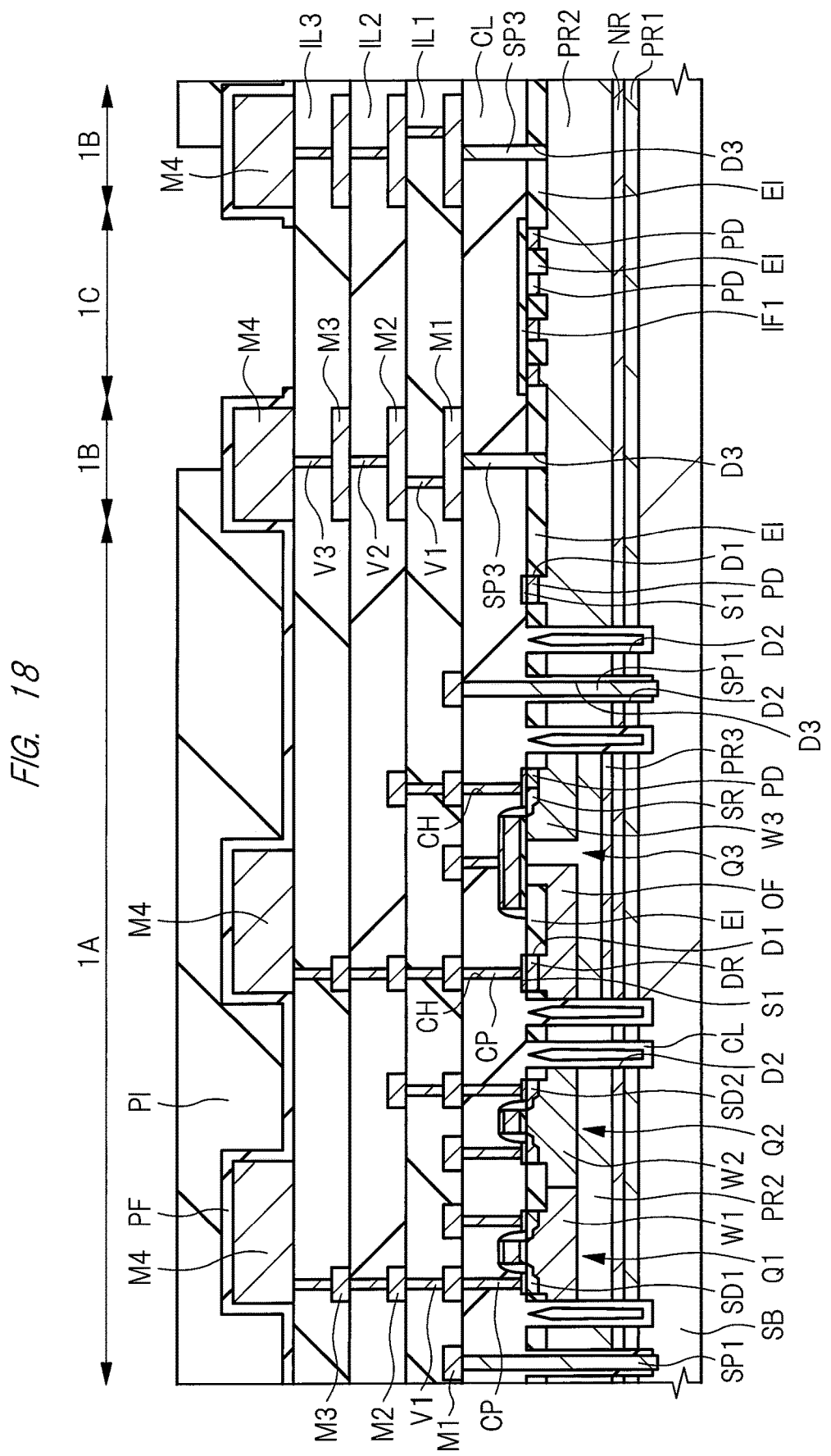
FIG. 18 is a cross-sectional view showing the manufacturing process of the semiconductor device continued from FIG. 17.

Hereinafter, a manufacturing method and a structure of a semiconductor device of the present embodiment will be described with reference to FIGS. 16 to 18. FIGS. 16 to 18 are cross-sectional views for describing the manufacturing process of the semiconductor device according to the second embodiment of the present invention. In FIGS. 16 to 18, the circuit region 1A, the seal ring region 1B, and the scribe region 1C are shown as in FIG. 4.

In the manufacturing process of the semiconductor device of the present embodiment, the process described with reference to FIGS. 6 to 8 is first performed. However, in this case, the element isolation region EI is formed to cover the entire upper surface of the epitaxial layer of the seal ring region 1B, and the trench D2 is not formed in the seal ring region 1B.

Next, as shown in FIG. 16, the interlayer insulating film CL and the DTI structure including the voids in the trenches D2 are formed through the process similar to that described with reference to FIG. 9. However, since the trench D2 is not provided in the seal ring region 1B in this case, the void is not formed in the seal ring region 1B.

Next, as shown in FIG. 17, the photoresist film PR and the trenches D3 are formed through the process similar to that described with reference to FIG. 10. The trench D2 and the void are not formed in the seal ring region 1B in the present embodiment, but the trench D3 is formed in the seal ring region 1B. The trench D3 of the seal ring region 1B is formed to penetrate the interlayer insulating film CL and the element isolation region EI, and reaches the bottom surface of the trench D1 for the element isolation region EI. A width in the transverse direction of the trench D3 is, for example, 0.5 μm, and is larger than the diameter of the contact hole CH. The subsequent processes are performed in the same manner as those described with reference to FIGS. 11 and 12, so that the semiconductor device of the present embodiment is completed as shown in FIG. 18.

In this manner, a substrate contact plug SP3 is formed in the trench D3 of the seal ring region 1B. The substrate contact plug SP3 is a substrate connection portion whose width in the transverse direction is, for example, 0.5 μm, and which is connected to the upper surface of the p-type semiconductor region PR2 at the bottom surface of the trench D1. Note that, in the present application, the conductive connection portion, which is formed in the trench D3 formed by the forming process of the trench D3 shown in FIGS. 10 and 17 and has a width in the transverse direction larger than the diameter of the contact plug CP, is referred to as a substrate contact plug (substrate connection portion) even though the conductive connection portion is not connected to the semiconductor substrate SB.

In the present embodiment, the substrate contact plug SP3 does not penetrate the p-type semiconductor regions PR2 and PR1 and the n-type buried region NR, and is not connected to the semiconductor substrate SB. However, by forming the trench D3 opened in the seal ring region 1B in the forming process of the trench D3 described with reference to FIG. 16, the opening ratio at the time of forming the trenches for the substrate contact plugs can be secured compared to the comparative example shown in FIG. 31, so that the same effects as those of the first embodiment described above can be obtained.

<First and Second Modifications>

Figure 19:
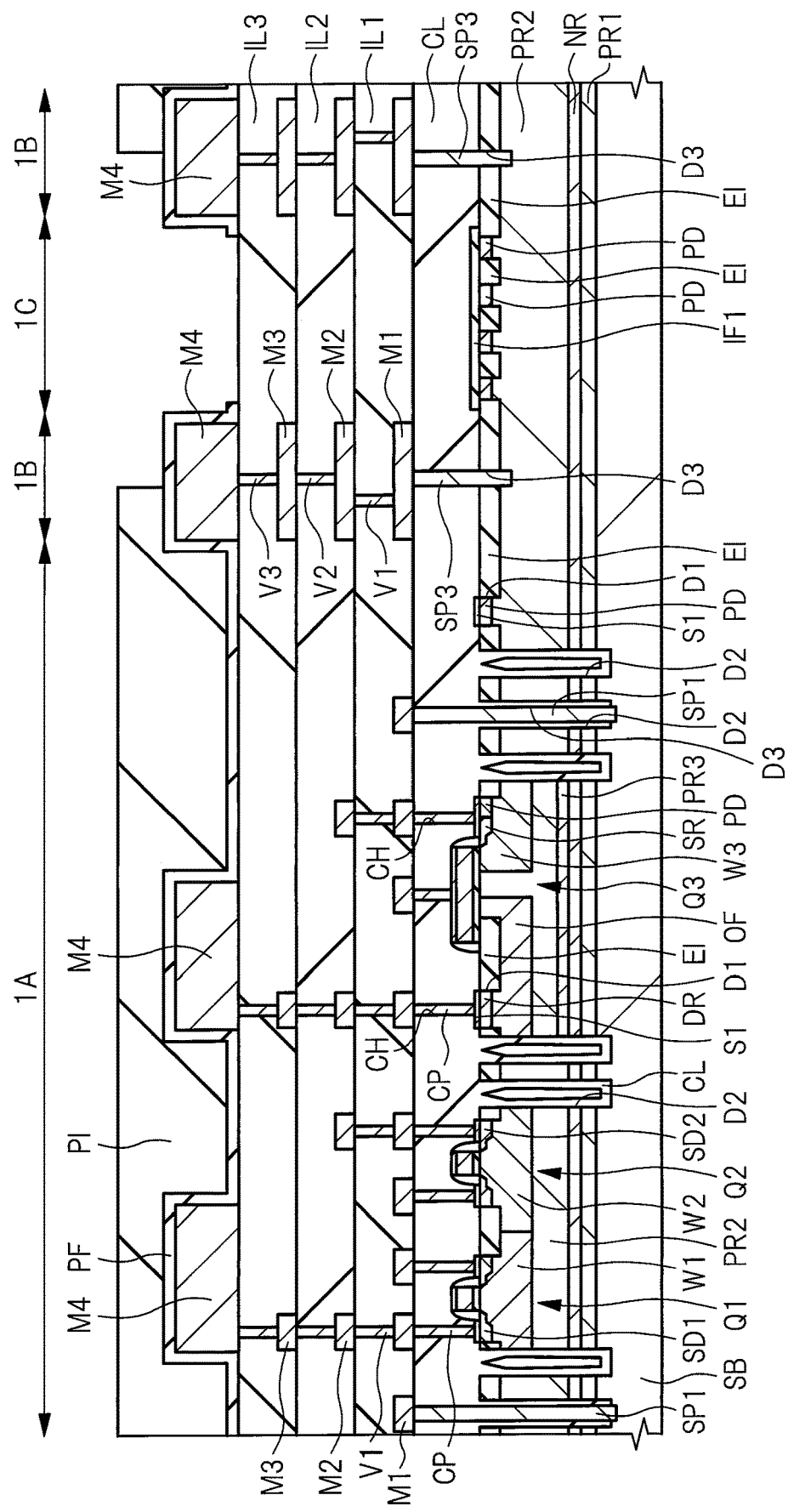
FIG. 19 is a cross-sectional view for describing a semiconductor device according to a first modification of the second embodiment of the present invention.
Figure 20:
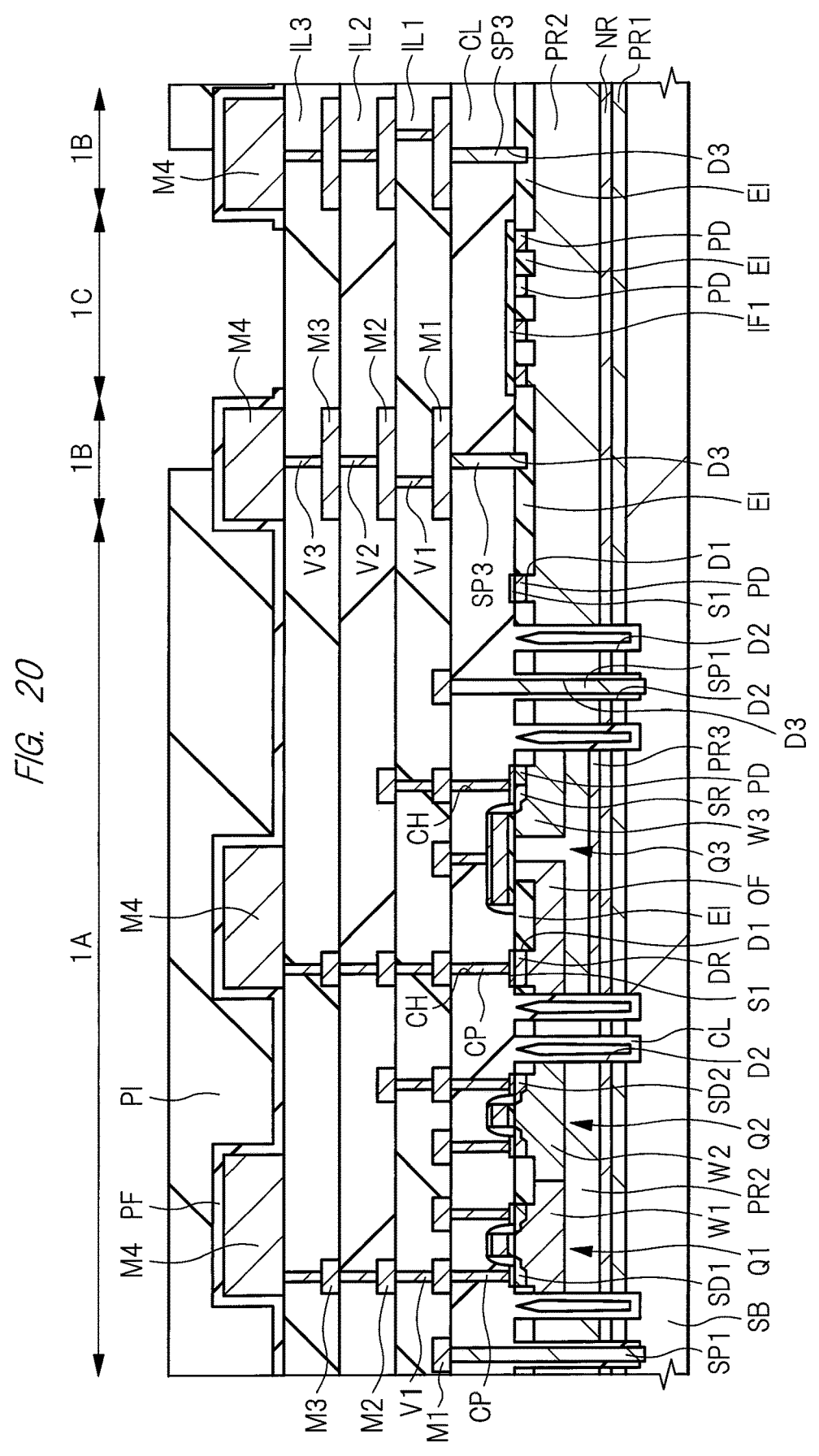

FIG. 19 shows a cross-sectional view for describing a semiconductor device according to a first modification of the second embodiment. As shown in FIG. 19, the substrate contact plug SP3 of the seal ring region 1B of the semiconductor device of the present embodiment may be formed to reach a position deeper than the bottom surface of the trench D1, that is, an intermediate depth of the p-type semiconductor region PR2 below the bottom surface. In addition, FIG. 20 shows a cross-sectional view for describing a semiconductor device according to a second modification of the second embodiment. As shown in FIG. 20, the bottom of the substrate contact plug SP3 of the seal ring region 1B of the semiconductor device of the present embodiment may be terminated at an intermediate depth of the element isolation region EI without reaching the stacked substrate.

The manufacturing method of the semiconductor device of the first and second modifications is similar to the method described with reference to FIGS. 16 to 18. Namely, the structure shown in FIG. 19 can be obtained when the trench D3 formed in the seal ring region 1B in the process described with reference to FIG. 16 is formed by digging the bottom surface of the trench D1. In addition, the structure shown in FIG. 20 can be obtained when the etching amount is relatively small and thus the trench D3 does not reach the bottom surface of the trench D1. Even in such cases, by forming the trench D3 opened in the seal ring region 1B in the forming process of the trench D3 described with reference to FIG. 16, the opening ratio at the time of forming the trenches for the substrate contact plugs can be secured compared to the comparative example shown in FIG. 31, so that the same effects as those of the first embodiment described above can be obtained.

However, as the structure for preventing moisture from entering the circuit region of the semiconductor chip and metallic contamination, the substrate contact plug SP3 preferably reaches the bottom surface of the trench D1 as shown in FIG. 19.

<Third Modification>

Figure 21:
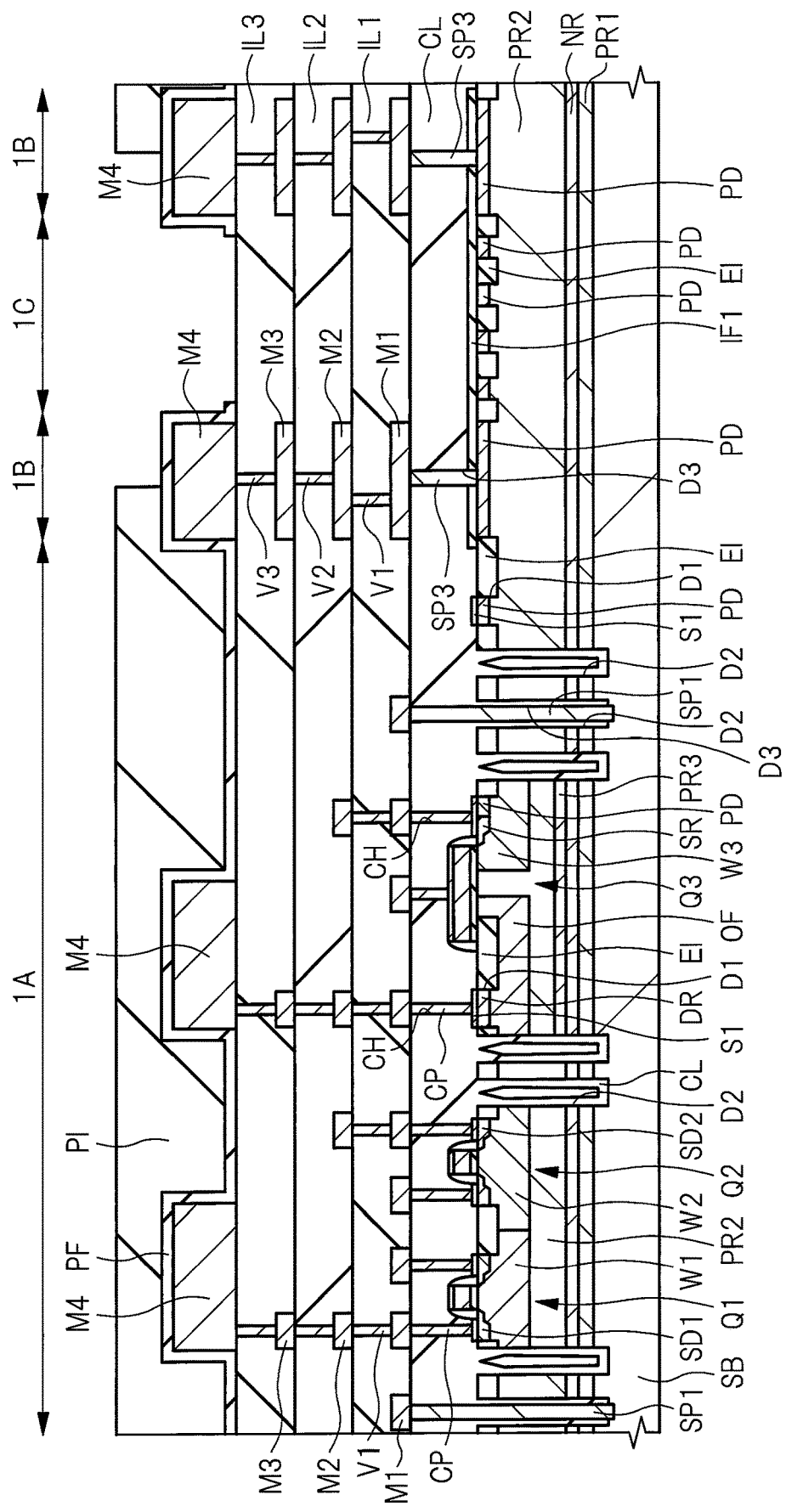
FIG. 21 is a cross-sectional view for describing a semiconductor device according to a third modification of the second embodiment of the present invention.

FIG. 21 shows a cross-sectional view for describing a semiconductor device according to a third modification of the second embodiment. As shown in FIG. 21, the substrate contact plug SP3 may be connected to the upper surface of the p-type diffusion region PD on the upper surface of the stacked substrate without forming the element isolation region EI on the stacked substrate of the seal ring region 1B of the semiconductor device of the present embodiment.

In the manufacturing method of the semiconductor device of the present modification, the p-type diffusion region PD is formed on the upper surface of the stacked substrate without forming the trench D1 and the element isolation region EI on the stacked substrate of the seal ring region 1B in the process described with reference to FIG. 6. Further, the insulating film IF1 is formed so as to cover the upper surface of the p-type semiconductor region PR2 of the seal ring region 1B in the process described with reference to FIG. 7. The other processes are similar to those of the manufacturing method of the semiconductor device described with reference to FIGS. 16 to 18.

Namely, in the process described with reference to FIG. 16, the trench D3 is formed to penetrate the insulating film IF1, and the bottom of the trench D3 is terminated at the upper surface of the p-type diffusion region PD when the trench D3 is formed in the seal ring region 1B.

As a result, the bottom of the substrate contact plug SP3 in the trench D3 formed in the seal ring region 1B is not buried in the concave portion of the upper surface of the stacked substrate. Even in such a case, by forming the trench D3 opened in the seal ring region 1B in the forming process of the trench D3 described with reference to FIG. 16, the opening ratio at the time of forming the trenches for the substrate contact plugs can be secured compared to the comparative example shown in FIG. 31, so that the same effects as those of the first embodiment described above can be obtained.

<Fourth Modification>

Figure 22:
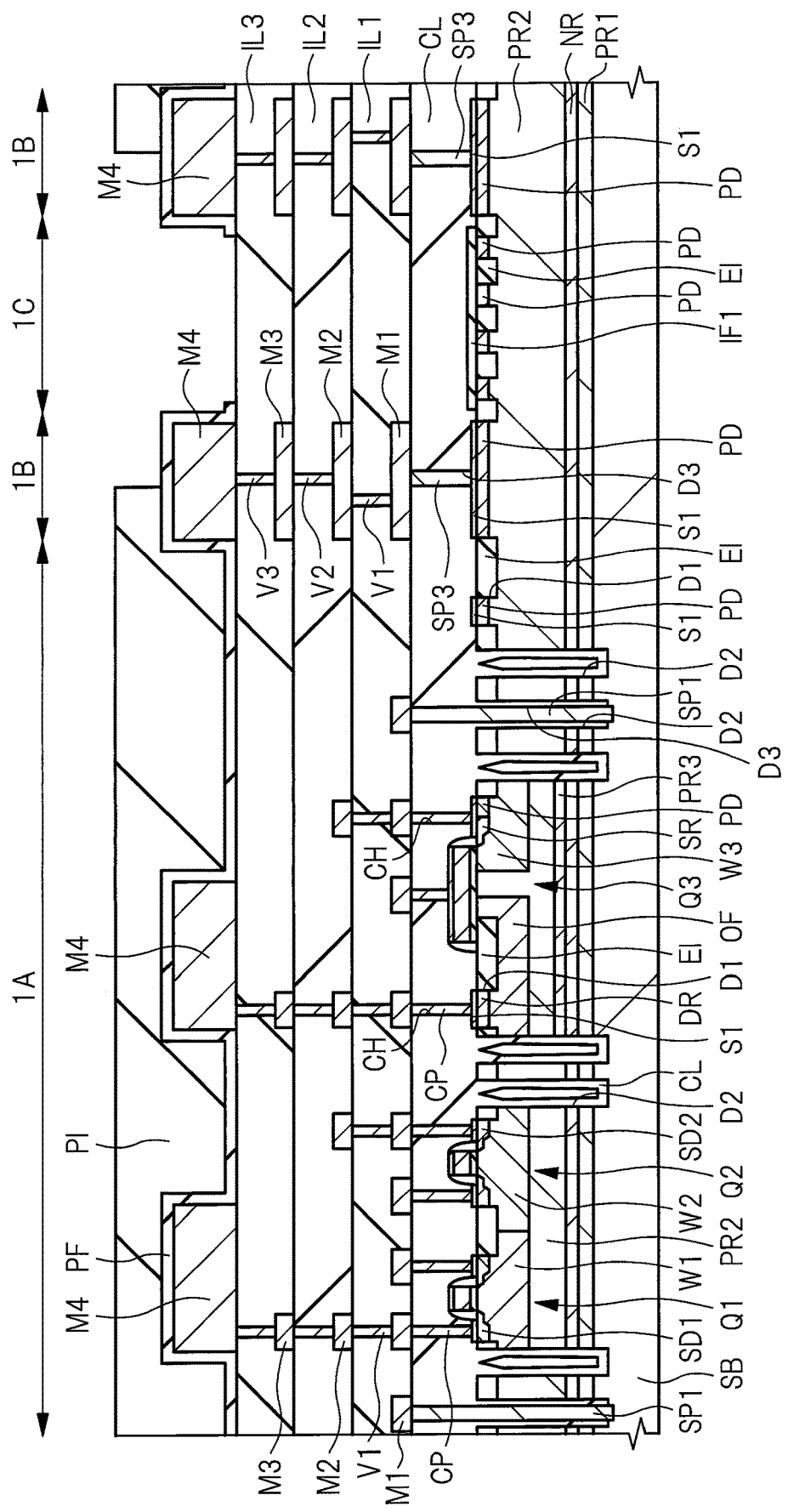
FIG. 22 is a cross-sectional view for describing a semiconductor device according to a fourth modification of the second embodiment of the present invention.

FIG. 22 shows a cross-sectional view for describing a semiconductor device according to a fourth modification of the second embodiment. As shown in FIG. 22, the substrate contact plug SP3 may be connected to the upper surface of the silicide layer S1 on the p-type diffusion region PD on the upper surface of the stacked substrate without forming the element isolation region EI on the stacked substrate of the seal ring region 1B of the semiconductor device of the present embodiment.

In the manufacturing method of the semiconductor device of the present modification, the p-type diffusion region PD is formed on the upper surface of the stacked substrate without forming the trench D1 and the element isolation region EI on the stacked substrate of the seal ring region 1B in the process described with reference to FIG. 6, and the other processes are similar to those of the manufacturing method of the semiconductor device described with reference to FIGS. 16 to 18. Namely, in the forming process of the silicide layer S1 described with reference to FIG. 7, the silicide layer S1 is formed also on the upper surface of the p-type diffusion region PD of the seal ring region 1B which is not covered with the insulating film IF1. Thereafter, in the process described with reference to FIG. 16, the silicide layer S1 serves as an etching stopper film when the trench D3 is formed in the seal ring region 1B because the silicide layer has a strong resistance against etching and is hardly processed. Therefore, the bottom of the trench D3 is terminated at the upper surface of the silicide layer S1.

As a result, the bottom surface of the substrate contact plug SP3 in the trench D3 formed in the seal ring region 1B is connected to the upper surface of the silicide layer S1, and the lower end of the substrate contact plug SP3 is not buried in the concave portion of the upper surface of the stacked substrate. Even in such a case, by forming the trench D3 opened in the seal ring region 1B in the forming process of the trench D3 described with reference to FIG. 16, the opening ratio at the time of forming the trenches for the substrate contact plugs can be secured compared to the comparative example shown in FIG. 31, so that the same effects as those of the first embodiment described above can be obtained.

<Fifth Modification>

Figure 23:
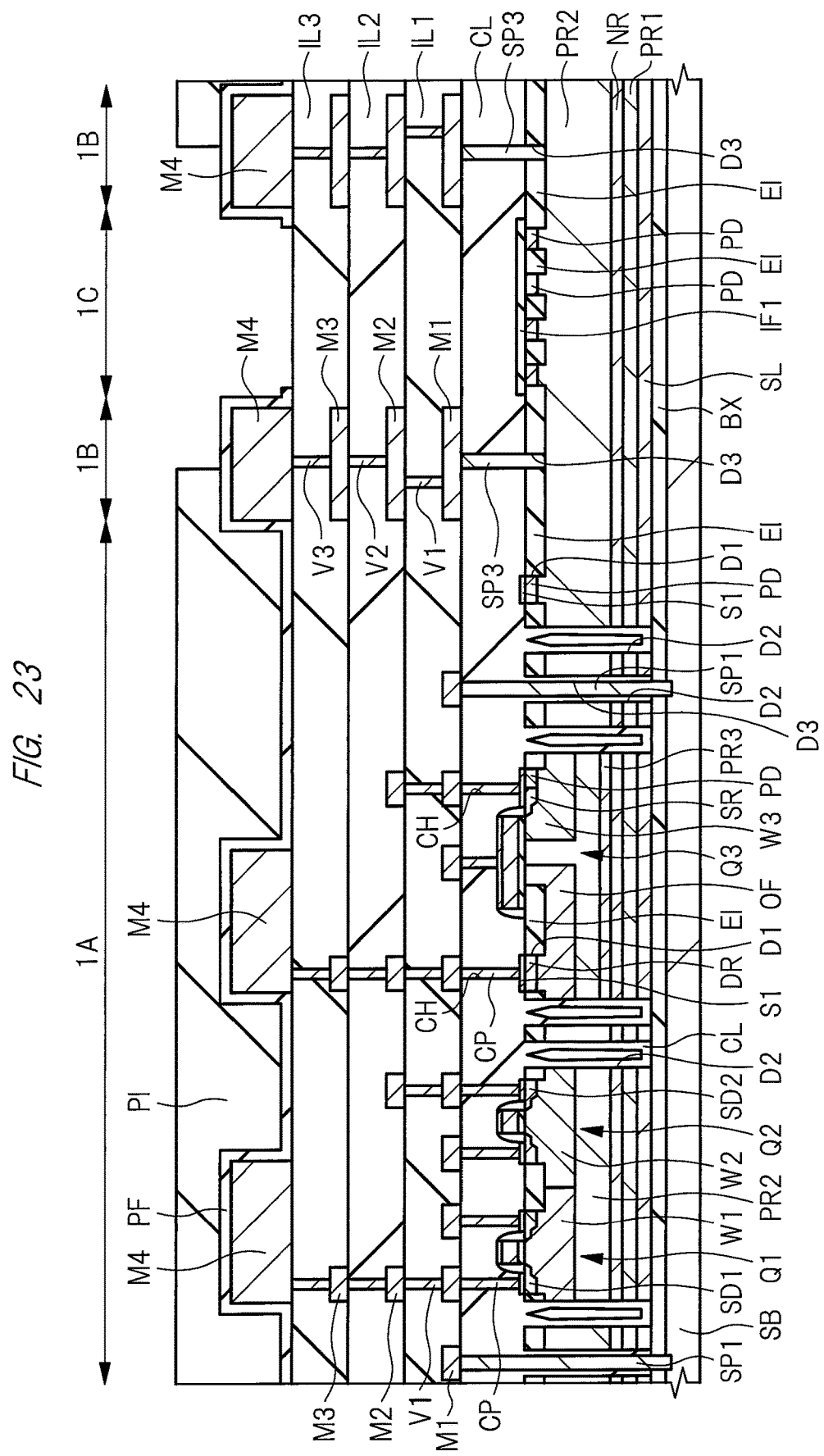
FIG. 23 is a cross-sectional view for describing a semiconductor device according to a fifth modification of the second embodiment of the present invention.

FIG. 23 shows a cross-sectional view for describing a semiconductor device according to a fifth modification of the second embodiment. As shown in FIG. 23, the SOI structure according to the second modification of the first embodiment described above may be applied to the present embodiment.

The semiconductor device of the present modification has the SOI substrate as in the semiconductor device shown in FIG. 14, and has the substrate contact plug SP3 whose lower end is connected to the bottom surface of the trench D1 in the seal ring region 1B as in the semiconductor device shown in FIG. 18. Even in such a case, by forming the trench D3 opened in the seal ring region 1B in the forming process of the trench D3 described with reference to FIG. 16, the opening ratio at the time of forming the trenches for the substrate contact plugs can be secured compared to the comparative example shown in FIG. 31, so that the same effects as those of the first embodiment described above can be obtained.

Third Embodiment

Figure 24:
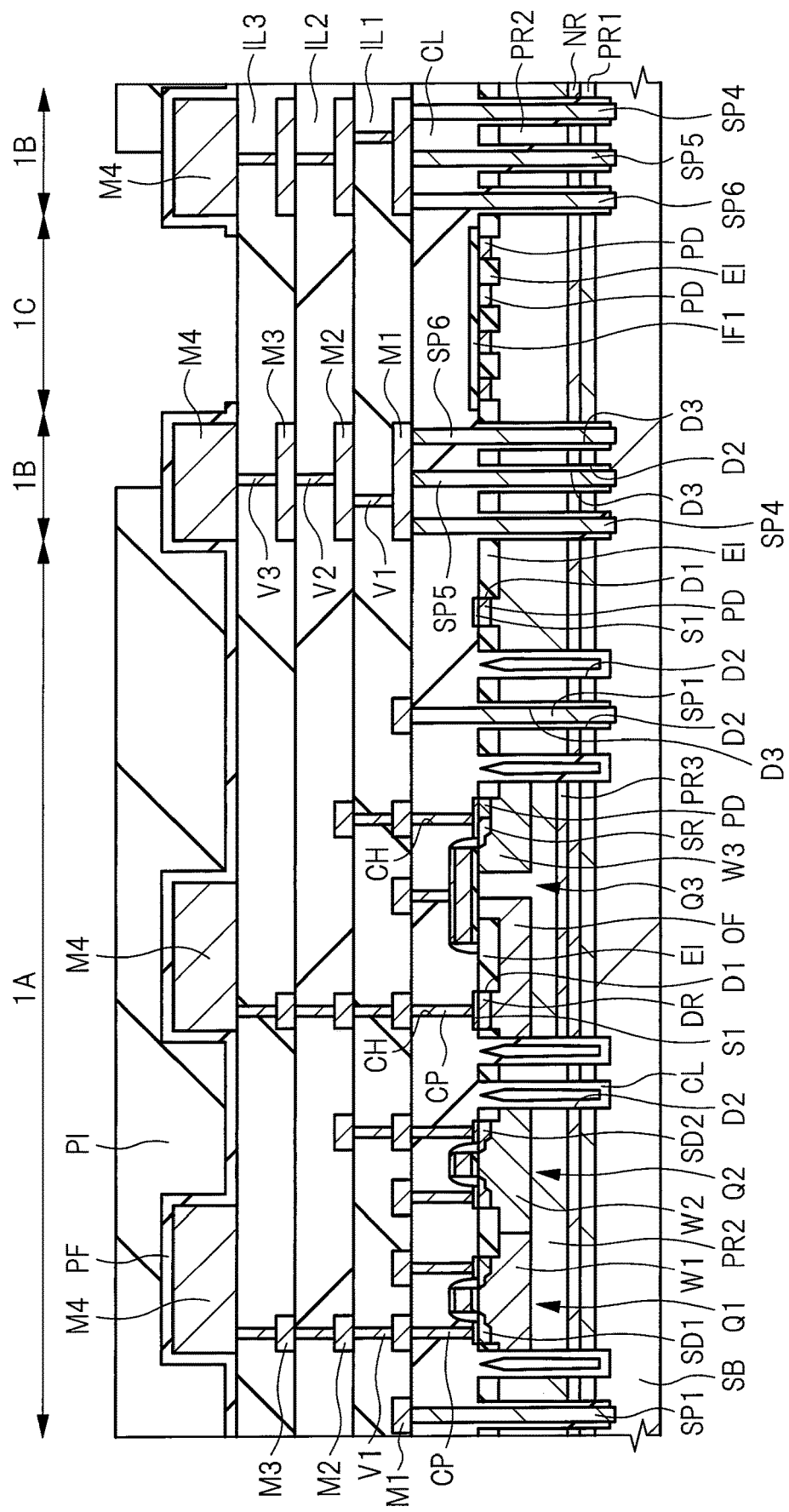
FIG. 24 is a cross-sectional view for describing a semiconductor device according to a third embodiment of the present invention.

Hereinafter, a semiconductor device according to a third embodiment will be described with reference to FIG. 24. In the present embodiment, a plurality of substrate contact plugs are formed in the seal ring region. FIG. 24 is a cross-sectional view for describing the semiconductor device according to the third embodiment of the present invention. FIG. 24 is a cross-sectional view of the circuit region 1A, the seal ring region 1B, and the scribe region 1C corresponding to FIG. 4.

As shown in FIG. 24, substrate contact plugs SP4, SP5, and SP6 arranged in the transverse direction of the seal ring region 1B are formed in the seal ring region 1B extending along four sides of the semiconductor chip CHP (see FIG. 3). Namely, in plan view, the substrate contact plugs SP4, SP5, and SP6 are sequentially disposed from a side near the circuit region 1A at the center of the semiconductor chip CHP toward the end of the semiconductor chip CHP. Herein, the substrate contact plugs SP4, SP5, and SP6 each have an annular structure in plan view.

Namely, the annular substrate contact plug SP5 surrounding the substrate contact plug SP4 is formed on the outer side of the annular substrate contact plug SP4 surrounding the circuit region 1A in plan view, and the annular substrate contact plug SP6 is formed so as to surround the substrate contact plug SP5. In other words, the triple substrate contact plugs are formed in the seal ring region 1B of the present embodiment. In short, the substrate contact plugs in multiple rows are arranged in the seal ring region 1B.

Each of the substrate contact plugs SP4, SP5, and SP6 has the structure similar to the substrate contact plug SP2 described with reference to FIG. 4. In the present embodiment, since the trenches D3 are opened in the seal ring region 1B, the same effects as those of the first embodiment described above can be obtained. In addition, the substrate contact opening ratio at the time of forming the trenches D3 can be increased by increasing the number of trenches D3 for the substrate contact in the seal ring region 1B. Namely, it is possible to more effectively prevent the increase in resistance value of the substrate contact plug SP1 in the circuit region 1A due to the occurrence of the altered layer described with reference to FIG. 31.

In addition, it is possible to reinforce the effect of the seal ring to prevent moisture from entering from the outside of the semiconductor chip and metallic contamination by increasing the number of the trenches D3 and the substrate contact plugs.

<First Modification>

Figure 25:
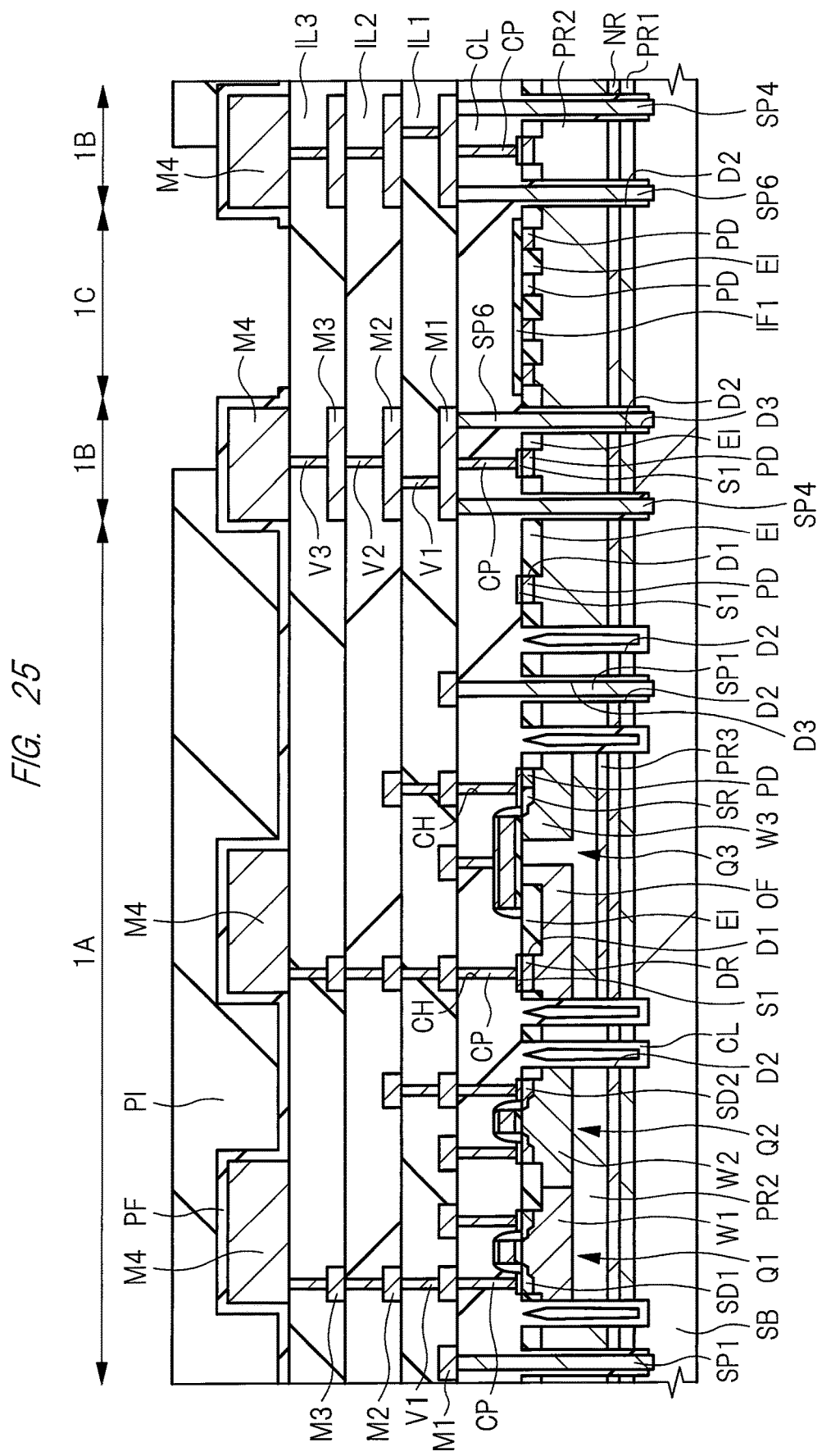
FIG. 25 is a cross-sectional view for describing a semiconductor device according to a first modification of the third embodiment of the present invention.

FIG. 25 shows a cross-sectional view for describing a semiconductor device according to a first modification of the third embodiment. As shown in FIG. 25, two substrate contact plugs SP4 and SP6 are formed in the seal ring region 1B, and the contact plug CP is formed between the substrate contact plugs SP4 and SP6. The contact plug CP is connected to the upper surface of the silicide layer S1 on the p-type diffusion region PD which is formed in the upper surface of the epitaxial layer. Namely, the contact plug CP having a relatively small diameter (width) and the substrate contact plugs SP4 and SP6 having a width in the transverse direction larger than the diameter of the contact plug CP are formed in the seal ring region 1B.

In the present modification, since the trench D3 for the substrate contact in the seal ring region 1B is additionally formed compared to the first embodiment described above, the substrate contact opening ratio can be increased at the time of forming the trenches D3. Therefore, it is possible to more effectively prevent the increase in resistance value of the substrate contact plug SP1 in the circuit region 1A due to the occurrence of the altered layer described with reference to FIG. 31.

In addition, it is possible to reinforce the effect of the seal ring to prevent moisture from entering from the outside of the semiconductor chip and metallic contamination by increasing the number of the trenches D3 and the substrate contact plugs and forming the contact plug CP in the seal ring region 1B.

<Second Modification>

Figure 26:
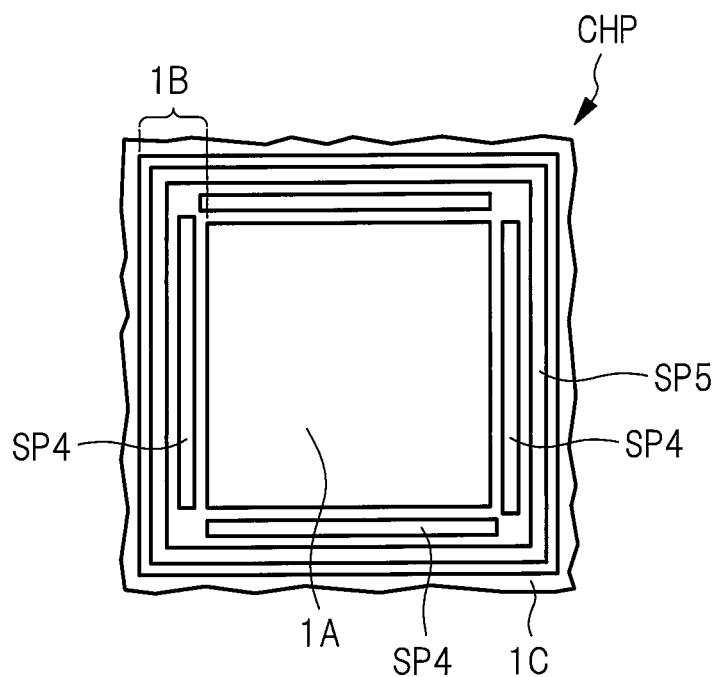
FIG. 26 is a plan view for describing a semiconductor device according to a second modification of the third embodiment of the present invention.

FIG. 26 shows a plan view for describing a semiconductor device according to a second modification of the third embodiment.

As shown in FIG. 26, the substrate contact plugs SP4 and SP5 arranged in the transverse direction are formed in the seal ring region 1B extending along each of the four sides of the semiconductor chip CHP. Namely, in plan view, the substrate contact plugs SP4 and SP5 are sequentially arranged from a side near the circuit region 1A at the center of the semiconductor chip CHP toward the end of the semiconductor chip CHP. Herein, in plan view, the substrate contact plug SP5 has an annular structure, but the substrate contact plug SP4 does not have an annular structure.

Specifically, one substrate contact plug SP4 is configured of a pattern extending in one direction along any one of the four sides corresponding to the ends of the semiconductor chip CHP, and the four substrate contact plugs SP4 are formed along the four sides of the ends of the circuit region 1A having a rectangular shape in plan view. The substrate contact plugs SP4 are not connected to each other in the vicinity of the corners of the semiconductor chip CHP in plan view.

Even when the substrate contact plugs SP4 are formed discontinuously as described above, the trench D3 for the substrate contact (see FIG. 4) in the seal ring region 1B is additionally formed in the present modification compared to the first embodiment, so that the substrate contact opening ratio at the time of forming the trenches D3 can be increased. Therefore, it is possible to effectively prevent the increase in resistance value of the substrate contact plug SP1.

In addition, since the substrate contact plug SP5 has an annular shape, it is possible to secure the effect of the seal ring to prevent moisture from entering from the outside of the semiconductor chip and metallic contamination. Note that the effect of the seal ring can be secured even when the substrate contact plug SP5 is formed as the contact plug CP having a narrow diameter like the contact plug CP shown in the seal ring region 1B of FIG. 25. In this case, however, since only the trench D3 in which the substrate contact plug SP4 is buried is formed in the seal ring region 1B, the effect to prevent the increase of the resistance value of the substrate contact plug SP1 by increasing the substrate contact opening ratio is similar to that of the first embodiment described above.

In addition, a desired substrate contact opening ratio can be easily obtained by changing the planar layout of the trenches D3 for the substrate contact plugs, and the degree of freedom in design can be improved.

<Third Modification>

Figure 27:
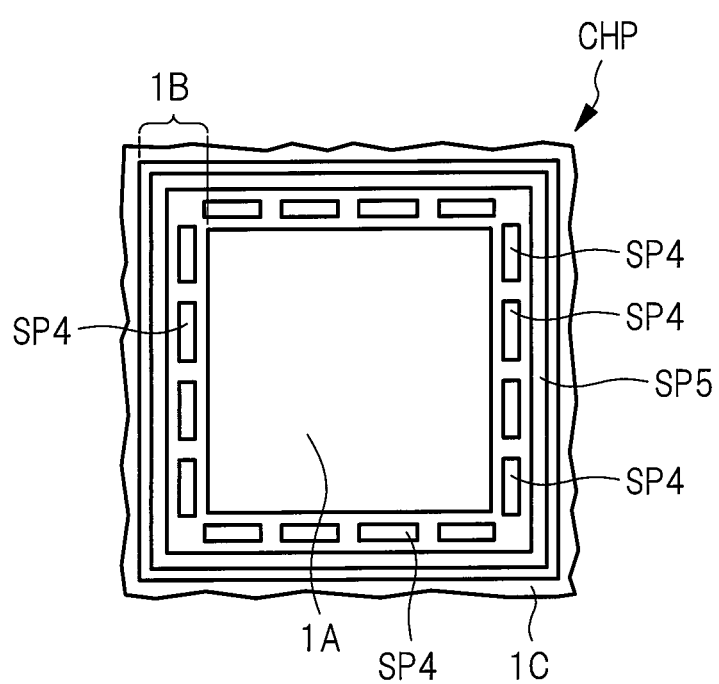
FIG. 27 is a plan view for describing a semiconductor device according to a third modification of the third embodiment of the present invention.

FIG. 27 shows a plan view for describing a semiconductor device according to a third modification of the third embodiment. The structure shown in FIG. 27 is different from the layout described with reference to FIG. 26 in that the substrate contact plug SP4 is further divided. Namely, in plan view, a plurality of substrate contact plugs SP4 extending along one side of the semiconductor chip CHP are arranged at an equal interval so as to surround the circuit region 1A. In other words, the plurality of substrate contact plugs SP4 are discretely disposed so as to surround the circuit region 1A.

Herein, the substrate contact plug SP5 has a continuous annular structure in plan view, and the substrate contact plugs SP4 are discretely arranged along four sides of the semiconductor chip CHP. Even though the substrate contact plugs SP4 are formed like a dashed line as described above, since the trench D3 for the substrate contact is formed in the seal ring region 1B, the substrate contact opening ratio at the time of forming the trenches D3 can be increased compared to the comparative example shown in FIG. 31. Therefore, it is possible to prevent the increase in the resistance value of the substrate contact plug SP1.

In addition, it is possible to reinforce the effect of the seal ring to prevent moisture from entering from the outside of the semiconductor chip and metallic contamination by increasing the number of the trenches D3 and the substrate contact plugs and forming the annular substrate contact plug SP5 in the seal ring region 1B. Note that the substrate contact plug SP5 of the present modification may be formed as the contact plug CP (see FIG. 25) whose diameter is smaller than the width in the transverse direction of the substrate contact plug SP4 as in the second modification described with reference to FIG. 26. In addition, a desired substrate contact opening ratio can be easily obtained by changing the planar layout of the trenches D3 for the substrate contact plugs, and the degree of freedom in design can be improved.

<Fourth Modification>

Figure 28:
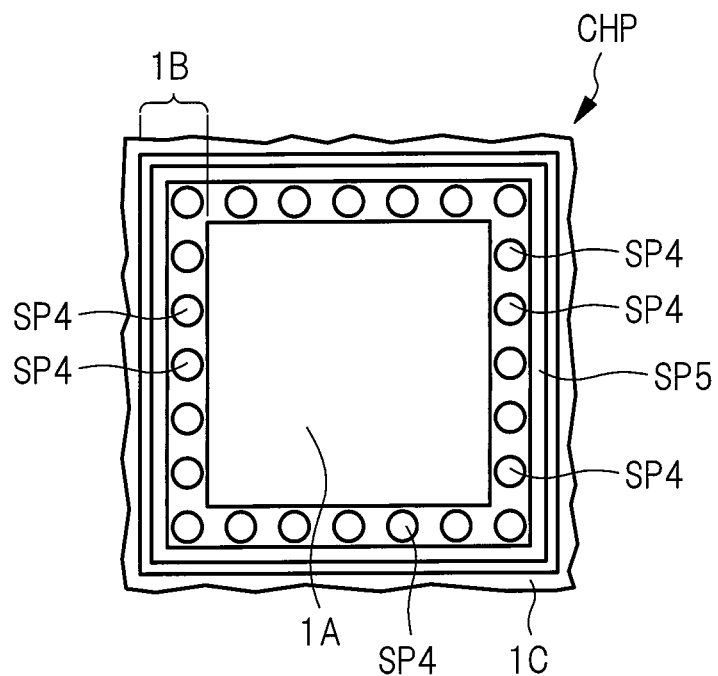
FIG. 28 is a plan view for describing a semiconductor device according to a fourth modification of the third embodiment of the present invention.

FIG. 28 shows a plan view for describing a semiconductor device according to a fourth modification of the third embodiment. The structure shown in FIG. 28 is different from the layout described with reference to FIG. 27 in that the substrate contact plug SP4 is formed as a cylindrical substrate connection portion. Namely, the trench D3 (see FIG. 4) for the substrate contact plug has a circular hole shape in plan view. In this case, each of the diameter of the trench D3 and the diameter of the substrate contact plug SP4 is, for example, 0.5 µm, and is larger than the diameter of the contact plug CP (see FIG. 4).

Even in the present modification, the same effect as that of the third modification described with reference to FIG. 27 can be obtained. Note that the substrate contact plug SP5 of the present modification may be formed as the contact plug CP whose diameter is smaller than the width in the transverse direction of the substrate contact plug SP4 as in the second modification described with reference to FIG. 26.

<Fifth Modification>

Figure 29:
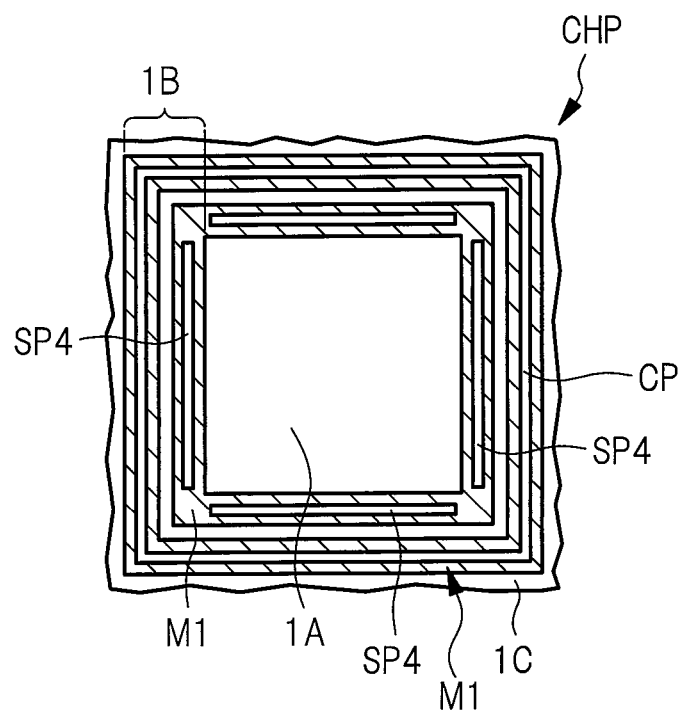
FIG. 29 is a plan view for describing a semiconductor device according to a fifth modification of the third embodiment of the present invention.
Figure 30:
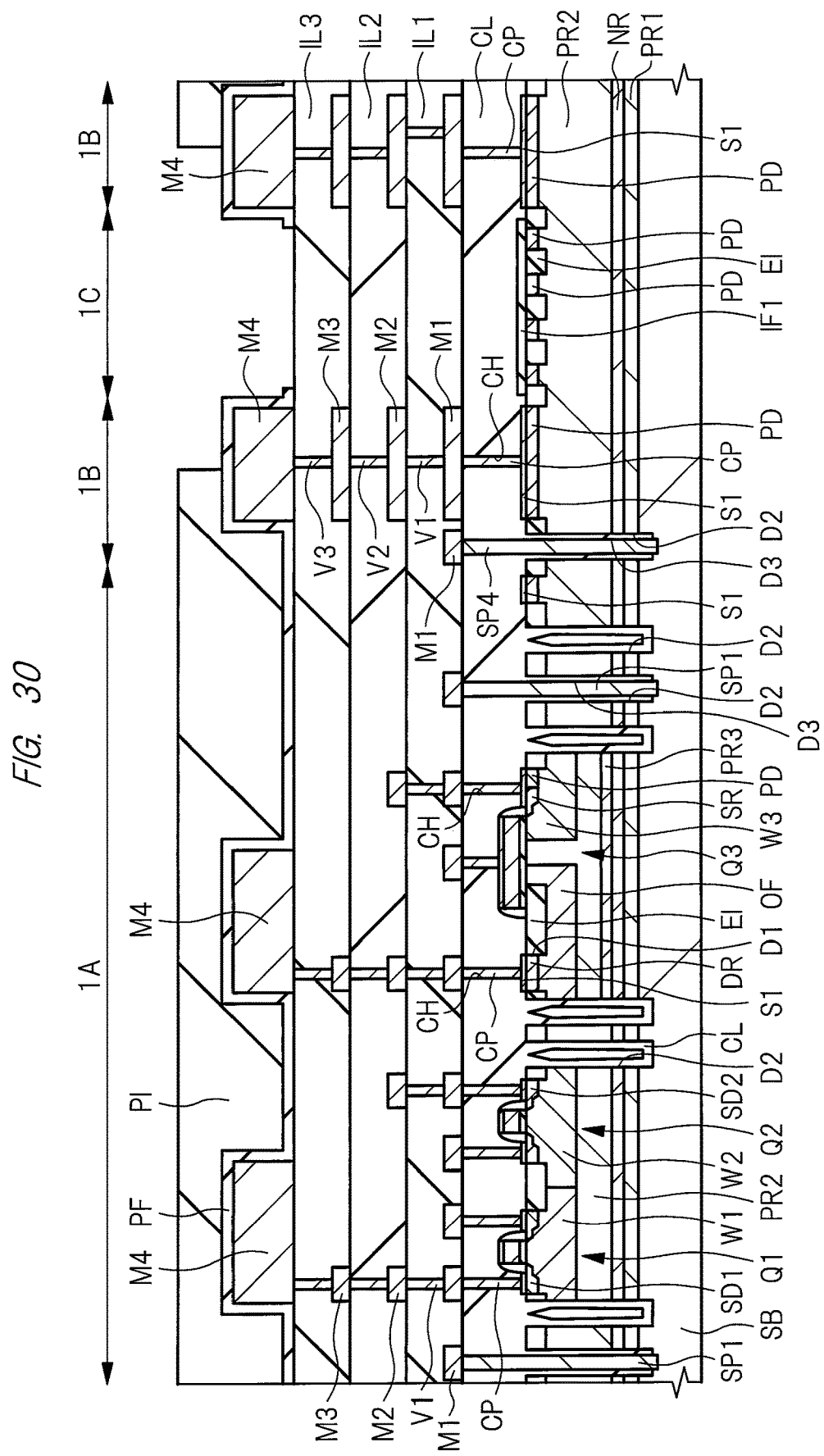
FIG. 30 is a cross-sectional view for describing the semiconductor device according to the fifth modification of the third embodiment of the present invention.

Hereinafter, a semiconductor device according to a fifth modification of the third embodiment will be described with reference to FIGS. 29 and 30. In the present modification, a plurality of conductive connection portions including the substrate contact plug or the contact plug are formed in the seal ring region. FIG. 29 is a plan view for describing the semiconductor device according to the fifth modification of the third embodiment of the present invention, and FIG. 30 is a cross-sectional view for describing the semiconductor device according to the fifth modification of the third embodiment of the present invention. FIG. 29 is a plan view of the semiconductor chip corresponding to FIG. 3, and FIG. 30 is a cross-sectional view of the circuit region 1A, the seal ring region 1B, and the scribe region 1C corresponding to FIG. 4.

In FIG. 29, two wirings M1 constituting the first wiring layer are shown, and the wirings M1 are hatched to make the drawing easily understood. In FIG. 29, the substrate contact plug SP4 and the contact plug CP immediately below the wiring M1 are shown through the wiring M1, and the substrate contact plug SP4 and the contact plug CP are not hatched.

As shown in FIG. 29, the substrate contact plug SP4 and the contact plug CP arranged in the transverse direction are formed in the seal ring region 1B extending along the four sides of the semiconductor chip CHP. Namely, in plan view, the substrate contact plug SP4 and the contact plug CP are sequentially disposed from a side near the circuit region 1A at the center of the semiconductor chip CHP toward the end of the semiconductor chip CHP. Herein, the contact plug CP has an annular structure, but the substrate contact plug SP4 does not have an annular structure. The layout of the substrate contact plug SP4 is similar to the layout of the substrate contact plug SP4 described with reference to FIG. 26.

As shown in FIGS. 29 and 30, the wiring M1 connected to the upper surface of the substrate contact plug SP4 and the wiring M1 connected to the upper surface of the contact plug CP of the seal ring region 1B are separated from each other. Namely, the substrate contact plug SP4 and the contact plug CP of the seal ring region 1B are connected to the different wirings M1.

As shown in FIG. 30, the substrate contact plug SP4 is connected to the semiconductor substrate SB, and the contact plug CP is connected to the upper surface of the silicide layer S1 on the p-type diffusion region PD which is formed on the upper surface of the p-type semiconductor region PR2 of the seal ring region 1B. The wiring M1 connected to the upper surface of the contact plug CP is connected to the wiring M4 through the vias V1 to V3 and the wirings M2 and M3. Namely, the contact plug CP of the seal ring region 1B and the wirings M1 to M4 and the vias V1 to V3 electrically connected to the contact plug CP have a function as a seal ring which protects the semiconductor chip CHP (see FIG. 29) from moisture, metallic contamination, or chipping.

The wiring M1 connected to the upper surface of the substrate contact plug SP4 in the seal ring region 1B and the wiring M1 connected to the upper surface of the contact plug CP of the seal ring region 1B do not form a circuit. Even when the wiring M1 connected to the upper surface of the substrate contact plug SP4 in the seal ring region 1B and the wiring M1 connected to the upper surface of the contact plug CP of the seal ring region 1B are formed separately as in the present modification, it is possible to obtain the same effect as that of the semiconductor device in a case where the substrate contact plug SP5 is replaced with the contact plug CP in the second modification described with reference to FIG. 26.

In addition, the contact plug CP shown in FIGS. 29 and 30 may be the substrate contact plug SP3 shown in the seal ring region 1B of FIG. 22.

In the foregoing, the invention made by the inventors of the present invention has been concretely described based on the embodiments. However, it is needless to say that the present invention is not limited to the foregoing embodiments and various modifications and alterations can be made within the scope of the present invention.

Likewise, apart of the contents described in the embodiments will be described below.

(1) A manufacturing method of a semiconductor device, including the steps of:

(a) preparing a semiconductor substrate which includes a first region and a second region surrounding the first region in plan view;

(b) forming an element isolation portion which is buried in a first trench formed in an upper surface of the semiconductor substrate of the first region;

(c) forming a plurality of elements near the upper surface of the semiconductor substrate of the first region;

(d) after the step (c) and the step (b), forming a first interlayer insulating film over the semiconductor substrate;

(e) forming second trenches, which penetrate the first interlayer insulating film and are deeper than the first trench, in the upper surface of the semiconductor substrate of the first region and the second region;

(f) forming a second interlayer insulating film over the semiconductor substrate so as to cover the second trenches, thereby forming a third interlayer insulating film made up of the first interlayer insulating film and the second interlayer insulating film;

(g) performing dry etching, thereby forming a third trench, which penetrates the third interlayer insulating film of the first region and passes through the second trench, and a fourth trench, which penetrates the third interlayer insulating film of the second region; and (h) forming a second conductive connection portion, which is buried in the third trench and forms a first circuit, and a third conductive connection portion, which is buried in the fourth trench and does not form a circuit, wherein the third conductive connection portion is not overlapped with the first trench and the second trench in plan view.

What is claimed is:

1. A semiconductor device, comprising:
a semiconductor substrate which includes a first region, a second region surrounding the first region in plan view, and a scribe region on a side of the second region opposite the first region in plan view;
a plurality of elements which are formed near an upper surface of the semiconductor substrate in the first region and forms part of a first circuit;
an element isolation portion which is buried in a first trench formed in the upper surface of the semiconductor substrate and isolates the plurality of elements from each other;
second trenches which are formed in the upper surface of the semiconductor substrate in the first region and in the second region, respectively, and are deeper than the first trench;
a first wiring which is formed over the semiconductor substrate in the first region via an interlayer insulating film and forms part of the first circuit;
a second wiring which is formed over the semiconductor substrate in the second region via the interlayer insulating film and does not form part of any circuit;
a first conductive connection portion which penetrates the interlayer insulating film and is connected to at least one of the plurality of elements;
a second conductive connection portion which is buried in the second trench in the first region and is connected to the semiconductor substrate at a bottom of the second trench in the first region; and
at least one third conductive connection portion, each being buried in a respective one of the second trenches in the second region and does not form part of any circuit,
wherein an upper surface of the second conductive connection portion is connected to the first wiring,
wherein an upper surface of the third conductive connection portion is connected to the second wiring, and
wherein each third conductive connection portion in the second region is disposed adjacent to the scribe region in plan view.

2. The semiconductor device according to claim 1, wherein widths of the second conductive connection portion and the at least one third conductive connection portion each are larger than a width of the first conductive connection portion in a direction along the upper surface of the semiconductor substrate.

3. The semiconductor device according to claim 1, wherein the at least one third conductive connection portion and the second wiring are formed in an annular shape so as to surround the first region in plan view.

4. The semiconductor device according to claim 1, wherein the at least one third conductive connection portion comprises a plurality of third conductive connection portions, and
wherein the plurality of third conductive connection portions are arranged in the second region.

5. The semiconductor device according to claim 1, wherein the semiconductor substrate includes:
a substrate; and
an insulating film and a semiconductor layer which are sequentially formed on the substrate, and
wherein the second conductive connection portion and the at least one third conductive connection portion penetrate the insulating film.

6. The semiconductor device according to claim 1, further comprising:
a fourth conductive connection portion which is formed at a position that, in plan view, does not overlap with the second trench in the second region and penetrates the interlayer insulating film,
wherein the fourth conductive connection portion does not form part of any circuit, and
wherein a width of the fourth conductive connection portion is larger than a width of the first conductive connection portion in a direction along the upper surface of the semiconductor substrate.

7. The semiconductor device according to claim 4,
wherein some of the plurality of third conductive connection portions are formed in an annular shape so as to surround the first region in plan view, and
wherein others of the plurality of third conductive connection portions are discretely arranged around the first region in plan view.

8. The semiconductor device according to claim 1, wherein, in plan view, each part of the at least one third conductive connection portion extends in a direction along which an adjacent part of the scribe region extends.

9. The semiconductor device according to claim 1, wherein, in plan view:
the scribe region defines an outer periphery of a semiconductor chip having the first and second regions; and
the second region is adjacent to said outer periphery and is constructed as a seal ring region for said semiconductor chip.

10. The semiconductor device according to claim 1, wherein, in plan view:
the scribe region has an annular shape;
each third conductive connection portion has an annular shape and is surrounded by the scribe region; and
the annular shape of each third conductive connection portion is centered with respect to the annular shape of the scribe region.

11. The semiconductor device according to claim 1, wherein another element isolation portion is buried in a first trench formed in the upper surface of the semiconductor substrate in the scribe region.

12. The semiconductor device according to claim 1, wherein:
the second conductive connection portion forms a substrate contact plug; and
the at least one third conductive connection portion forms a dummy substrate contact plug.

* * * * *